(12) United States Patent
Miyawaki et al.

(10) Patent No.: US 6,515,908 B2
(45) Date of Patent: Feb. 4, 2003

(54) NONVOLATILE SEMICONDUCTOR MEMORY DEVICE HAVING REDUCED ERASE TIME AND METHOD OF ERASING DATA OF THE SAME

(75) Inventors: Yoshikazu Miyawaki, Hyogo (JP); Satoshi Shimizu, Hyogo (JP); Atsushi Ohba, Hyogo (JP); Mitsuhiro Tomoeda, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/845,300

(22) Filed: May 1, 2001

(65) Prior Publication Data

US 2002/0057599 A1 May 16, 2002

(30) Foreign Application Priority Data

Nov. 16, 2000 (JP) ........................ 2000-349765

(51) Int. Cl.[7] ............................................. G11C 16/06
(52) U.S. Cl. ............................. 365/185.22; 365/185.24; 365/185.27
(58) Field of Search ......................... 365/185.22, 185.3, 365/185.29, 185.24, 185.19, 185.11, 185.27, 185.26

(56) References Cited

U.S. PATENT DOCUMENTS

| 5,642,311 | A | * | 6/1997 | Cleveland et al. | ...... 365/185.29 |
| 6,031,774 | A | * | 2/2000 | Chung | ........................ 365/204 |
| 6,122,198 | A | * | 9/2000 | Haddad et al. | ........ 365/185.22 |
| 6,285,599 | B1 | * | 9/2001 | Shimada et al. | ....... 365/185.22 |

FOREIGN PATENT DOCUMENTS

JP           4-6698           1/1992

* cited by examiner

Primary Examiner—David Nelms
Assistant Examiner—Thong Le
(74) Attorney, Agent, or Firm—McDermott, Will & Emery

(57) ABSTRACT

Erasing is performed two times for narrowing a distribution width of threshold voltages of memory cells, and reducing the number of memory transistors to be subjected to over-erase verify. The erase verify voltage for the first erasing is set more strictly than the erase verify voltage for the second erasing. The erase pulses for the second erasing can be reduced in number, and the erasing time can be further reduced.

17 Claims, 29 Drawing Sheets

SELECTED BIT

SELECTED BIT

VTH DISTRIBUTION BEFORE APPLICATION OF ERASE PULSE

VTH DISTRIBUTION DURING ERASING

VTH DISTRIBUTION AFTER ERASING

VG-VD CHARACTERISTICS OF ERASED CELLS WITH VARIOUS VTH'S

SELECTED BIT

VTH DISTRIBUTION BEFORE APPLICATION
OF BLOCK PROGRAM PULSE BEFORE ERASURE

VTH DISTRIBUTION DURING BLOCK
PROGRAMMING BEFORE ERASURE

VTH DISTRIBUTION AFTER BLOCK
PROGRAMMING BEFORE ERASURE

NONVOLATILE SEMICONDUCTOR MEMORY DEVICE HAVING REDUCED ERASE TIME AND METHOD OF ERASING DATA OF THE SAME

BACKGROUND OF THE INVENTION

1. Field of the Invention

The present invention relates to a nonvolatile semiconductor memory device, and particularly a nonvolatile semiconductor memory device of a flash type.

2. Description of the Background Art

A nonvolatile semiconductor memory device of a flash type, i.e., a flash memory is functionally a nonvolatile semiconductor memory device of an entire memory block erasing type allowing electrical programming and erasing. Since such nonvolatile semiconductor memory devices are inexpensive and electrically erasable, they are in great demand for use in portable devices and others, and the research and development of them have been increasingly done in recent years. The flash memory uses transistors (which will be referred to as "memory transistors" hereinafter) as memory cells. These transistors include floating gates, and have variable threshold voltages, respectively.

The flash memory of the NOR type utilizes hot channel electrons for writing or programming, and therefore can achieve a high write speed.

The NOR type flash memory performs the erasing by changing the threshold voltage of memory transistor from a high to a low.

At present, a flash memory of a type, in which electrons in the floating gate are extracted through an edge into a source region in the erase operation, is the mainstream in the NOR type flash memories. In this invention, description will be made by way of example on applied voltages in the NOR type flash memory, in which electrons are extracted through a whole channel surface for performing the erasing. The NOR type flash memory, in which the erasing is performed by extracting electrons through the whole channel surface, allows scale-down of the cell sizes in contrast to the flash memory of the conventional edge extracting type.

FIG. 21 is a flowchart showing an example of the most simple erase sequence of the conventional flash memory.

Referring to FIG. 21, after an erase command is input in step S101, an erase pulse having a predetermined pulse strength is applied to a memory transistor in subsequent step S102.

Then, determination by an erase verify function is performed in step S103 for determining whether erasing is completed or not.

When it is determined in step S103 that information held in the memory cell is not erased, the processing returns to step S102, and steps S102 and S103 will be repeated until the threshold voltage of memory transistor decreases to or below an erase determination voltage so that the application of the erase pulse and the erase verify are repeated.

When it is determined in step S103 that the threshold voltage of memory transistor is equal to or lower than the erase determination voltage, the processing advances to step S104, and the erasing operation ends.

FIG. 22 is a circuit diagram of a memory block for showing voltages, which are applied during application of the erase pulse in step S102 shown in FIG. 21.

Referring to FIG. 22, this memory block includes memory transistors; which are arranged in n rows and m columns, and each has a floating gate. For applying the erase pulse, a source line potential $V_{SL}$ and a well potential $V_{well}$ are both set to 8 V. All word lines for activating the memory transistors in the respective rows are set to −10 V. All bit lines BL1–BLm for reading data from the memory transistors in the respective columns are set to an open state.

FIG. 23 shows voltages applied to the memory transistor when the erase pulse is applied.

Referring to FIG. 23, source line potential $V_{SL}$ applied to a source of the memory transistor and well potential $V_{well}$ applied to a substrate of the memory transistor are both set to 8 V. A word line potential $V_{WL}$ applied to the word line for selecting the memory transistor is set to −10 V. In this state, a drain of the memory transistor is in the open state. Since a high electric field is applied not only between the gate and the source but also between the gate and the substrate, erasing is performed by extracting electrons through the whole channel surface of the memory transistor.

FIG. 24 is a circuit diagram showing voltages which are applied for erase verify performed in step S103 of the sequence shown in FIG. 21.

Referring to FIG. 24, well potential $V_{well}$ and source line potential $V_{SL}$ are both set to 0 V. Word line WLi which selects the memory transistor corresponding to the selected bit is set to 3.5 V, and the other word lines are all set to 0 V. Bit line BLj connected to the memory transistor corresponding to the selected bit is set to 1.0 V, and the other bit lines are all set to 0 V. The potentials are set as described above, and a current flowing through the memory transistor is determined, whereby it is determined whether erasing of memory transistor MT(i, j) is completed or not.

FIG. 25 shows voltages applied to the memory transistor corresponding to the selected bit in FIG. 24.

Referring to FIG. 25, both the source and well of selected memory transistor MT(i, j) are set to 0 V. The memory transistor receives 3.5 V on its gate, and also receives 1.0 V on its drain.

Description will now be made on voltage setting in the read operation of the conventional flash memory.

FIG. 26 is a circuit diagram showing the voltage setting in the read operation of the conventional flash memory.

Referring to FIG. 26, word line WLi which is connected to the gate of the memory transistor corresponding to the selected bit is set to 4.5 V, and the other word lines are all set to 0 V. In this state, source line potential $V_{SL}$ and well potential $V_{well}$ are both set to 0 V.

FIG. 27 shows potentials applied to the memory transistor which is selected in the read operation shown in FIG. 26.

Referring to FIG. 27, both the source and well of the memory transistor corresponding to the selected bit are set to 0 V. The drain carries 1.0 V, and the gate carries 4.5 V. In this state, when the threshold voltage of memory transistor is high, a current does not flow from the drain to the source. When the threshold voltage of memory transistor is low, a current flows from the drain to the source. By detecting this current, it can be determined whether data is already programmed into the memory transistor or not.

When an erase sequence of the conventional flash memory shown in FIG. 21 is used, such a problem may arise that a part of the memory transistors are over-erased. The over-erased state will now be described.

FIG. 28 shows a distribution of the threshold voltages before application of the erase pulse.

Referring to FIG. 28, a programmed state where the memory transistor has stored "0" and an erased state where the memory transistor has stored "1" are present in the initial state of the erasing operation, i.e., before the erase command is applied in step S101 in FIG. 21. The ordinate in FIG. 28 gives the number of memory transistors holding the respective threshold voltages in the memory block.

In the NOR type flash memory, the state where the threshold voltage is high corresponds to the programmed state, i.e., the state where "0" is held. The state where the threshold voltage is low corresponds to the erased state, i.e., the state where "1" is held.

In the state shown in FIG. 28, the memory block has already stored data through the preceding sequence, and the numbers of memory transistors in the programmed state and the erased state depend on this stored state, respectively. The memory transistors in the programmed state have the threshold voltages distributed in the range not lower than 5.5 V, and the memory transistors in the erased state have the threshold voltages distributed in a range not exceeding 3.5 V.

FIG. 29 shows an incompletely erased state where the data in all the bits are not completely erased even after the erase pulse was applied in the erase sequence shown in FIG. 21.

Referring to FIGS. 21 and 29, the erase pulse of a predetermined width is applied collectively to all the memory transistors in the memory block in step S102. Thereby, erasing is collectively performed on a memory block by memory block basis by an FN (Fowler-Nordheim) tunnel current. Therefore, when the block containing the memory transistors in the erased state as well as the memory transistors in the programmed state as shown in FIG. 28 is collectively supplied with the erase pulse, the memory cells in the erased state as well as the memory cells in the programmed state shift toward the side, on which the memory cells carry lower threshold voltages in FIG. 28.

FIG. 30 shows a distribution of the threshold voltages in the case where the erase verify is completed in step S103 shown in FIG. 21.

Referring to FIG. 30, after the erase verify is completed, all the memory transistors in the memory block have the threshold voltages no equal to 3.5 V or less. However, it can be seen that the threshold voltages of the respective memory transistors in the memory block are distributed over a considerably wide range. Thus, the threshold voltages in FIG. 30 unpreferably exhibit a large distribution width.

As a result, the memory cells having a threshold voltage of 1 V or less, i.e., the memory cell in the over-erased state are present, as represented by a hatched portion. In the over-erased state, the memory transistor may form a transistor of a depression type in which a drain current flows even when a gate voltage is 0 V.

The foregoing wide distribution is due to variations in threshold voltage of the memory transistors in the erased state as well as variations in threshold voltage of the memory transistors in the programmed state shown in FIG. 28. These variations are further increased by applying the same erase pulse to the memory transistors in the erased state and the memory transistors in the programmed state.

FIG. 31 shows characteristics of the gate voltage and the drain current of the memory transistors having respective threshold voltages in the erased state.

Referring to FIG. 31, when the threshold voltage is 1.5 V or 3.5 V, and gate voltage Vg is 0 V, the drain current is smaller than a determination value. When the threshold voltage is 0 V, however, a current equal to the predetermined determination value flows through the memory transistor even when gate voltage Vg is equal to 0 V. Further, in the memory transistor having the threshold voltage of −1.0 V, the drain current disadvantageously flows unless the gate voltage is set to a considerably negative potential.

From comparison between the over-erased memory transistors and the normally erased memory transistors, it can be seen that a large leak current flows even when the over-erased memory transistor forms the depression transistor, and has the gate voltage of 0 V, i.e., when the memory transistor is in the unselected state.

When the above over-erased memory transistor is present, a large leak current flows on the same bit line due to the memory transistor in the unselected and over-erased state when the verify and read are performed with the voltages shown in FIGS. 25 and 27. As a result, the current value of the selected memory transistor cannot be determined due to a sum total of the above leak current. Thus, it is impossible to read out data. Consequently, accurate verify and read are impossible.

FIG. 32 is a flowchart showing a flow employing countermeasures against the problem of over-erasing in the erase sequence shown in FIG. 21.

Referring to FIG. 32, when the erase command is applied in step S111, the erase pulse is collectively applied to the entire memory block in step S112 so that the FN tunnel current changes the threshold voltage. Then, erase verify is executed in step S113. Steps S113 and S112 are repeated until the erased state is detected in all the memory cells. When the erased state is detected in all the memory cells in step S113, the processing advances to step S114.

In step S114, over-erase verify is performed for verifying whether the memory transistor is over-erased or not. More specifically, processing is performed to detect the memory transistor, of which threshold voltage takes a certain value (e.g., 1.5 V) or less after the erase verify is completed. When the over-erased memory transistor is detected, the processing advances to step S115, and over-erase recovery is performed bit by bit. The over-erase recovery is a function of recovering the data bit by bit with channel hot electrons (CHE), and therefore a function of positively increasing the threshold voltage in each memory transistor. The processing advances to step S116, in which it is determined whether the memory transistor in the over-erased state is present or not.

When it is verified that the over-erased memory transistor is not present, the processing advances to step S117. In step S117, the over-recovery verify is performed again because there is a possibility that the over-erase recovery function performed in step S115 caused over-recovery. When the over-recovery is detected, the processing advances to step S112 again. If the memory transistor in the excessively recovered state is not present, the processing advances to step S118, and the erasing ends.

FIG. 33 is a circuit diagram showing voltages which are applied to the memory block during the over-erase verify executed in step S114 shown in FIG. 32.

Referring to FIG. 33, word line WLi for selecting the memory transistor corresponding to the selected bit is supplied with 1.5 V in the over-erase verify operation. The other word lines are supplied with 0 V. A bit line BLj connected to the drain of the memory transistor corresponding to the selected bit is supplied with 1.0 V, and the other bit lines are supplied with 0 V. Source line potential $V_{SL}$ and well potential $V_{well}$ are already set to 0 V.

FIG. 34 shows voltages which are applied to the memory transistor corresponding to the selected bit in the over-erase verify operation.

Referring to FIG. 34, the memory transistor of the selected bit receives 0 V on its source and substrate. Also, it receives 1.5 V on its gate, and receives 1.0 V on its drain.

In this manner, a voltage slightly lower than that in the read operation is applied to the gate, and it is determined whether a current flows between the source and drain or not. Thereby, the memory transistor in the over-erased state can be detected.

FIG. 35 is a circuit diagram showing voltages which are applied to the memory block during the over-erase recovery performed bit by bit in step S115 shown in FIG. 32.

Referring to FIG. 35, in the operation of bit by bit over-erase recovery, 7 V is applied to word line WLi selecting the memory transistor corresponding to the selected bit, and the other word lines are supplied with 0 V. Bit line BLj connected to the drain of the memory transistor corresponding to the selected bit is supplied with 4 V. The other bits are supplied with 0 V. Source line potential $V_{SL}$ and well potential $V_{well}$ are both set to 0 V.

By setting the gate voltage to a value higher than that (e.g., 4.5 V) in the normal read operation, the drain current flows even through the memory transistor having the threshold voltage in the normal, i.e., "0" state. The above voltage may be applied to the memory transistor corresponding to the selected bit, and it may be detected that the current does not flow, whereby the memory transistor in the over-erased state can be detected.

In the case of the erase sequence shown in FIG. 32, recovery is effected on the over-erased memory transistor so that the verify and read can be performed accurately. However, a time is required for the over-erase recovery operation performed bit by bit and the verification thereof. This results in disadvantageous increase in total erase time.

FIG. 36 is a flowchart showing the erase sequence for further reducing the erase time of the erase sequence in FIG. 32.

Referring to FIG. 36, when the erase command is applied in step S111, the processing advances to step S121, and bit by bit program before erasure, i.e., an operation of biasing on a bit by bit basis is performed using channel hot electrons. This bit by bit program before erasure is performed for the purpose of initially setting the erased bits shown in FIG. 28 to the programmed state, and thereby uniformizing the threshold voltages before application of the erase pulse. For changing and uniformizing the threshold voltages, channel hot electrons are used. This narrows the distribution width of the threshold voltages after completion of the erase verify, and therefore reduces the number of the memory transistors to be subjected to the over-erase recovery.

Accordingly, the total erase time can be short. Steps S112–S118 are similar to those shown in FIG. 32, and therefore description thereof is not repeated.

However, even in the case of the erase sequence in which bit by bit program before erasure is performed as shown in FIG. 36, the bit by bit program before erasure requires a long time, resulting in a problem that the total erase time cannot be reduced sufficiently.

FIG. 37 is a flowchart for further reducing the erase time of the erase sequence shown in FIG. 36.

Referring to FIG. 37, this erase sequence includes step S131 instead of step S121 in the flowchart shown in FIG. 36. Instep S131, block program before erasure is collectively executed on a memory block by memory block basis before application of the erase pulse.

According to this manner, the bit by bit programming shown in FIG. 36 is not performed so that the erase time can be reduced.

FIG. 38 is a circuit diagram showing voltages which are applied to the memory block for performing block program before erasure in step S131 shown in FIG. 37.

Referring to FIG. 38, source line potential $V_{SL}$ and well potential $V_{well}$ are both set to −8 V. All word lines WL1–WLn are set to +10 V. Further, all bit lines BL1–BLm are set to the open state.

FIG. 39 shows voltages applied to the memory transistor for block program before erasure shown in FIG. 38.

Referring to FIG. 39, the source and well of the memory transistor are supplied with −8 V, and the gate thereof is supplied with +10 V. The drain is set to the open state. According to this setting, a high electric field is applied between the channel portion and gate of the transistor so that electrons are implanted from the channel portion into the floating gate, and the threshold voltage increases. Thereby, programming is entirely effected on the memory transistors in the memory block.

FIG. 40 shows a distribution of the threshold voltages before the block program before erasure in step S131 of the erase sequence shown in FIG. 37.

Referring to FIG. 40, the memory transistors storing "1" have the threshold voltages of 3.5 V or less. The memory transistors storing "0" have the threshold voltages which are distributed in a range between 5.5 V and 7 V.

FIG. 41 shows a distribution of the threshold voltages of the memory transistors during the block program before erasure.

Referring to FIG. 41, when the block program before erasure is performed, the threshold voltages of the memory transistors holding "1" shown in FIG. 40 and the threshold voltages of the memory transistors holding "0" are shifted to a larger side.

FIG. 42 shows a distribution of the threshold voltages exhibited after completion of the block program before erasure.

Referring to FIG. 42, when the threshold voltages of all the memory transistors are 5.5 V or more, the transistors having the threshold voltages increased to about 9 V are present due to variations in threshold voltage. The memory transistors having the increased threshold voltages deteriorate the reliability because an extremely high electric field is applied to tunnel oxide films of the memory cells.

SUMMARY OF THE INVENTION

An object of the invention is to provide a nonvolatile semiconductor memory device, which can reduce a total erase time, and can ensure high reliability.

In summary, the invention provides a nonvolatile semiconductor memory device including a memory block, a plurality of word lines, a plurality of bit lines, a potential generating portion and a program/erase control portion.

The memory block includes a plurality of nonvolatile memory transistors arranged in rows and columns. The plurality of word lines select the rows of the memory transistors, respectively. The plurality of bit lines are provided corresponding to the columns of the memory transistors. The potential generating portion generates potentials to be applied to the plurality of word lines, the plurality of bit lines, and substrates and sources of the plurality of memory transistors. The program/erase control portion controls the potential generating portion to erase data in the memory block.

The program/erase control portion includes a first setting portion, a second setting portion and a recovery control portion. The first setting portion collectively and repetitively applies a first erase pulse to the plurality of memory transistors to set the plurality of memory transistors to a first erased state. The second setting portion sets the plurality of memory transistors to a second erased state providing the over-erased memory transistors smaller in number than the over-erased memory transistors in the first erased state. The recovery control portion selectively performs the recovery on the over-erased memory transistors when the second erased state is verified.

Each memory transistor is an MOS transistor having a floating gate. The first erased state is the state, in which the plurality of memory transistors have the threshold voltages equal to or smaller than a first value. The second erased state is the state, in which the plurality of memory transistors have the threshold voltages equal to or smaller than a second value.

According to another aspect of the invention, a method of erasing data of a nonvolatile semiconductor memory device provided with a memory block including a plurality of nonvolatile memory transistors arranged in rows and columns, a plurality of word lines for selecting the rows of the memory transistors, respectively, a plurality of bit lines provided corresponding to the columns of the memory transistors, a potential generating portion for generating potentials to be applied to the plurality of word lines, the plurality of bit lines, and substrates and sources of the plurality of memory transistors, and a program/erase control portion for controlling the potential generating portion to erase data in the memory block, includes the steps of collectively and repetitively applying a first erase pulse to the plurality of memory transistors to set the plurality of memory transistors to a first erased state; setting the plurality of memory transistors to a second erased state providing the over-erased memory transistors smaller in number than the over-erased memory transistors in the first erased state; and performing selectively the recovery on the over-erased memory transistors when the second erased state is verified.

Each memory transistor is an MOS transistor having a floating gate. The first erased state is the state, in which the plurality of memory transistors have the threshold voltages equal to or smaller than a first value. The second erased state is the state, in which the plurality of memory transistors have the threshold voltages equal to or smaller than a second value.

According to the invention, an erase verify voltage for the second erasing is set larger than the erase verify voltage for the first erasing so that the times of application of the erase pulse can be small in number, and therefore a data erasing time of the memory block can be reduced.

The foregoing and other objects, features, aspects an advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figure, the same or corresponding portions bear the same reference numbers.

First Embodiment

Figure 1:
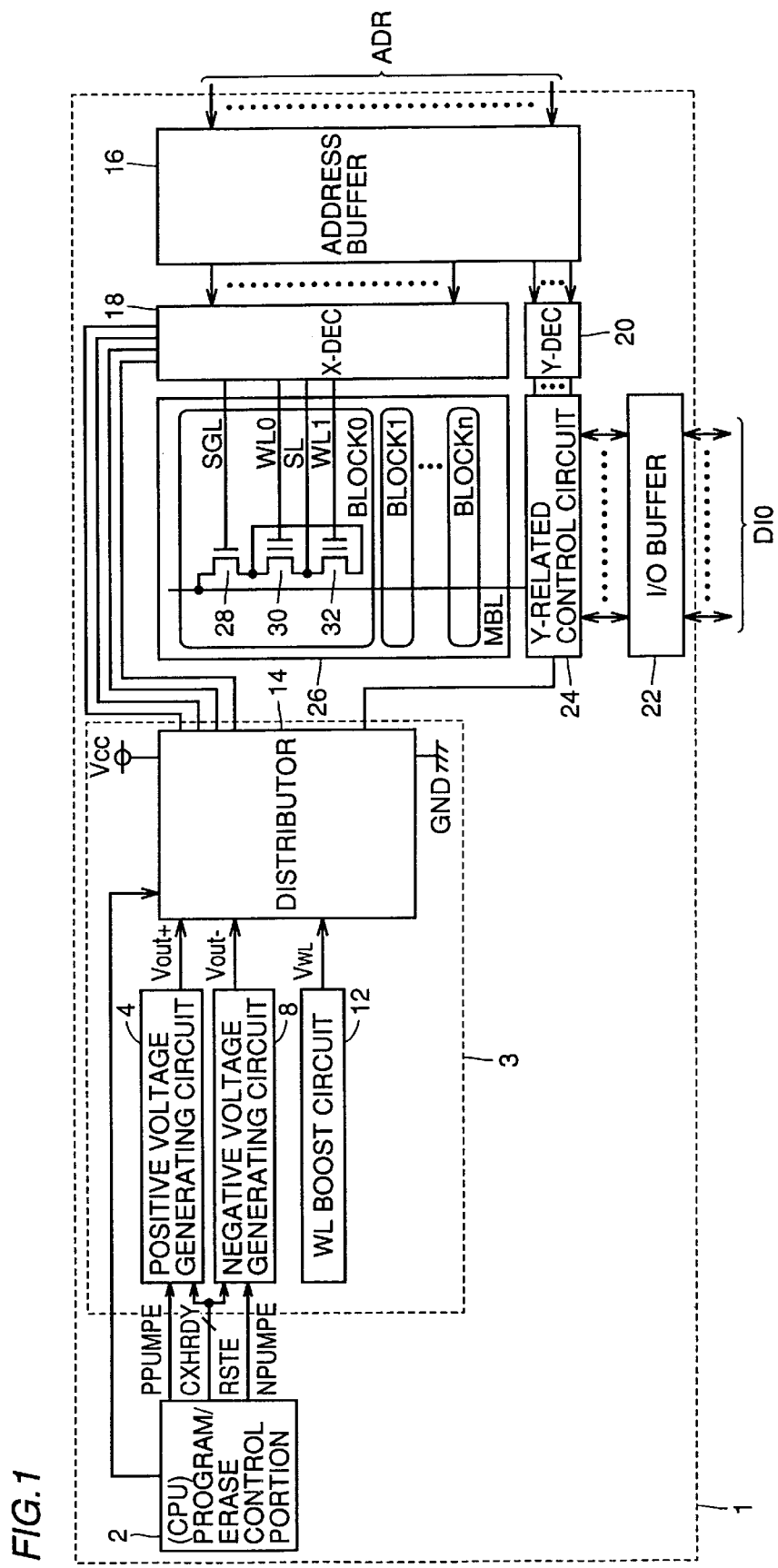
FIG. 1 is a block diagram showing a schematic structure of a nonvolatile semiconductor memory device 1 according to the invention.

FIG. 1 is a block diagram showing a schematic structure of a nonvolatile semiconductor memory device 1 according to the invention.

Referring to FIG. 1, nonvolatile semiconductor memory device 1 includes a program/erase control portion 2 which internally includes an ROM for controlling programming and erasing based on program codes held in this ROM, a voltage generating portion 3 which receives a standby signal CXHRDY, a charge pump activating signal PPUMPE and a reset signal RSTE from program/erase control portion 2, and issues output potentials Vout+, Vout– and $V_{WL}$ according to these received signals, respectively, an address buffer 16 which receives an externally supplied address signal ADR, an X-decoder 18 which receives an internal address signal sent from address buffer 16 and potentials generated by voltage generating portion 3, and determines respective potentials on a select gate line SGL, word lines WL0 and WL1, a source line SL and a well, an input/output buffer 22 for sending and receiving a data input/output signal DIO, a Y-decoder 20 which receives and decodes the address signal sent from address buffer 16, and a Y-related control circuit 24 which applies a high voltage to a main bit line MBL in accordance with the data I/O signal corresponding to the output of Y-decoder 20.

Voltage generating portion 3 includes a positive voltage generating circuit 4 which receives standby signal CXHRDY, charge pump activating signal PPUMPE and reset signal RSTE, and generates output potential Vout+ in accordance with these received signals, a negative voltage generating circuit 8 which receives standby signal CXHRDY, reset signal RSTE and charge pump activating signal NPUMPE, and generates output potential Vout–, a WL boost circuit 12 generating word line potential $V_{WL}$, and a distributor 14 which is controlled by program/erase control portion 2 to receive output potentials Vout+ and Vout– as well as word line potential $V_{WL}$ and distribute them to the respective internal circuits.

Although not shown, X-decoder 18 includes a WL decoder for selecting the word lines, an SG decoder for selecting a select gate, a WELL decoder for selecting a well region corresponding to the selected memory block, and an SL decoder for selecting a source line.

Y-related control circuit 24 includes YG and sense amplifiers as well as latch circuits for performing column selection in a read operation, and performing the read operation by the sense amplifiers, and also includes a page buffer for determining, based on the latched data, whether a high potential is to be applied to main bit line MBL in the write or program operation.

WL boost circuit 12 is a circuit for generating a boosted potential to be applied to word line WL and select gate SG, which are selected in the read operation, for achieving fast access.

Nonvolatile semiconductor memory device 1 further includes a memory array 26. Memory array 26 includes memory blocks BLOCK0–BLOCKn which are formed within individually isolated wells, respectively.

Memory block BLOCK0 includes memory cells 30 and 32, and a select gate 28. In memory block BLOCK0, the memory cells which correspond to select gate line SGL, word lines WL0 and WL1 and source line SL selected by X-decoder 18 are selected, and a signal corresponding to data is supplied from main bit line MBL, and is held therein. FIG. 1 shows, as typical examples, select gate 28 and memory cells 30 and 32 corresponding to selected select gate line SGL, word lines WL0 and WL1, and source line SL.

Figure 2:
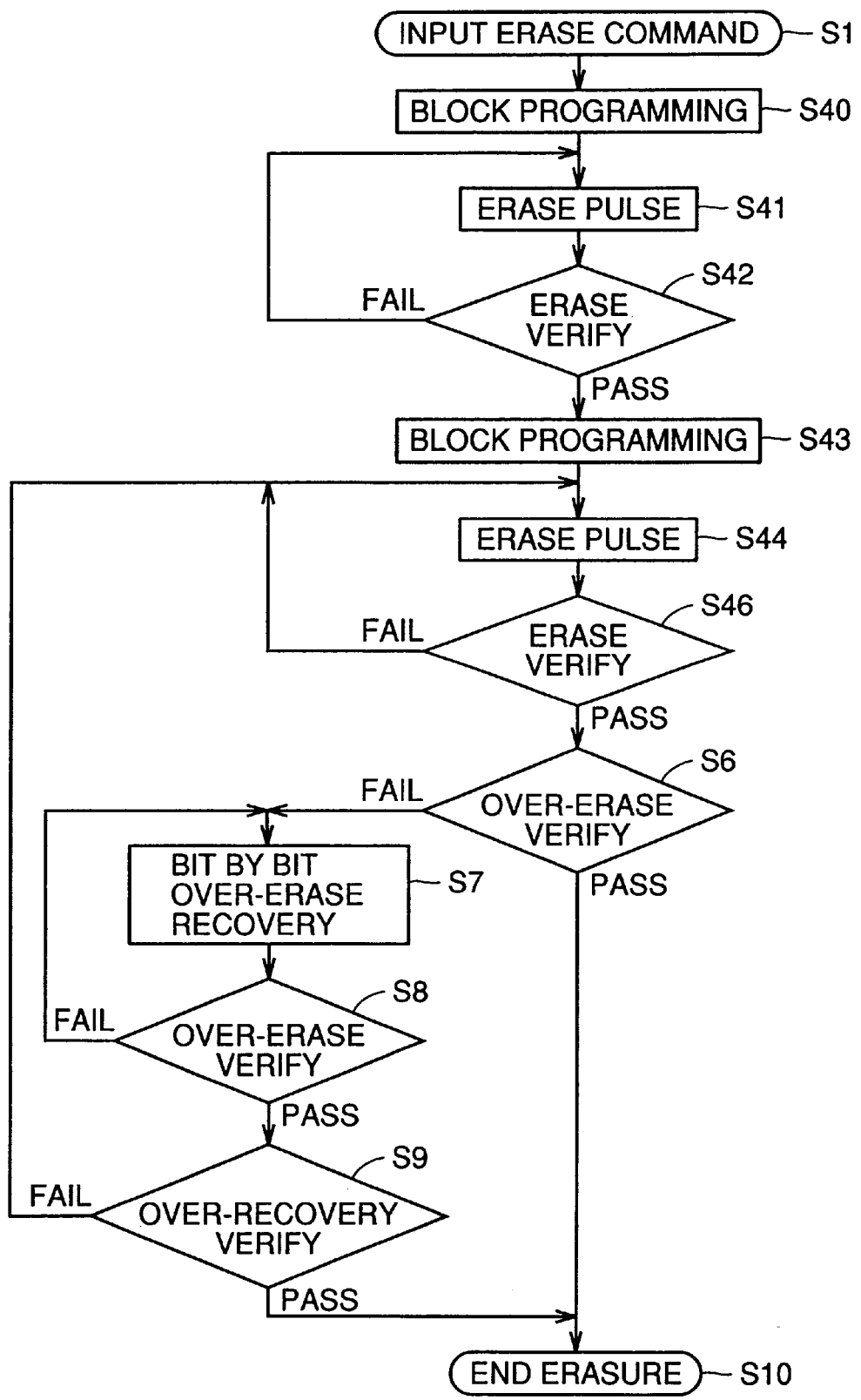
FIG. 2 is a flowchart showing an erase sequence of a flash memory controlled by a program/erase control portion 2 in FIG. 1.

FIG. 2 is a flowchart showing an erase sequence of a flash memory which is controlled by program/erase control portion 2 shown in FIG. 1.

Figure 38:
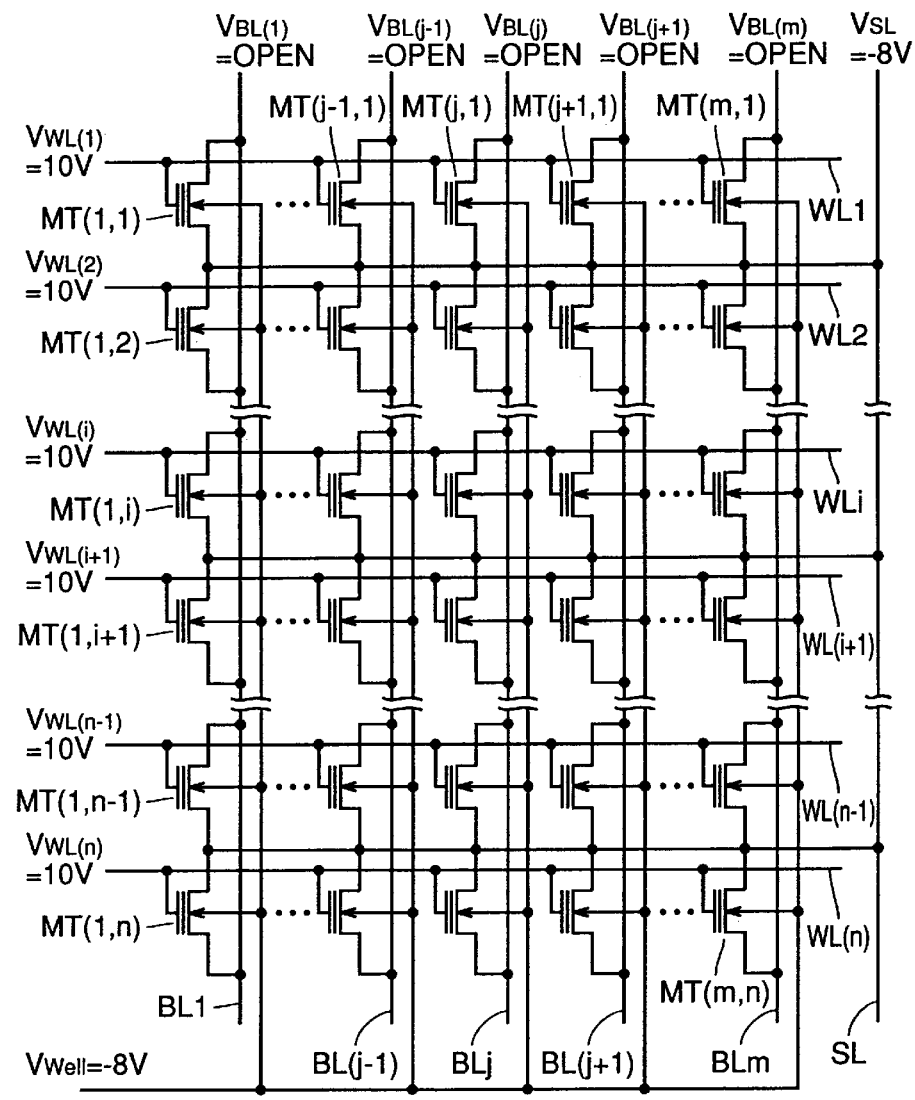
FIG. 38 is a circuit diagram showing voltages applied to the memory block for performing block program before erasure in step S131 shown in FIG. 37.
Figure 39:
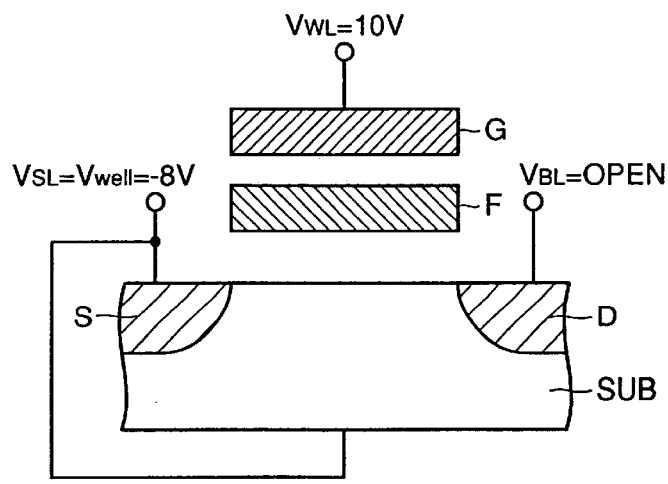
FIG. 39 shows voltages applied to the memory transistor when performing the block program before erasure shown in FIG. 38.
Figure 40:
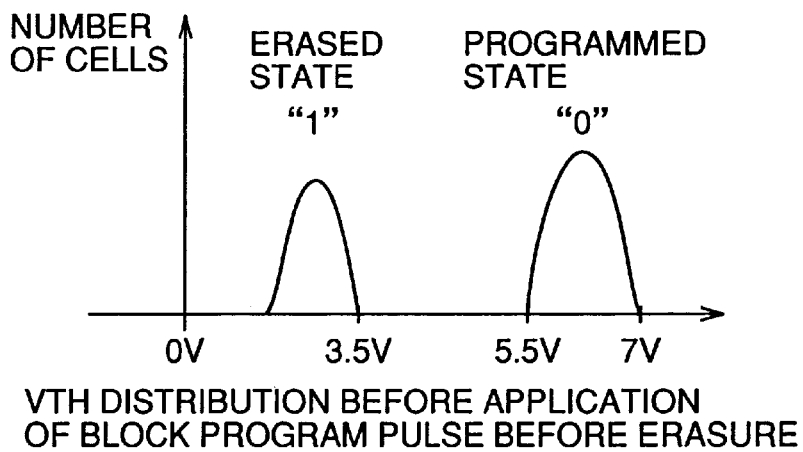
FIG. 40 shows a distribution of the threshold voltages before performing the block program before erasure in step S131 of the erase sequence shown in FIG. 37.
Figure 41:
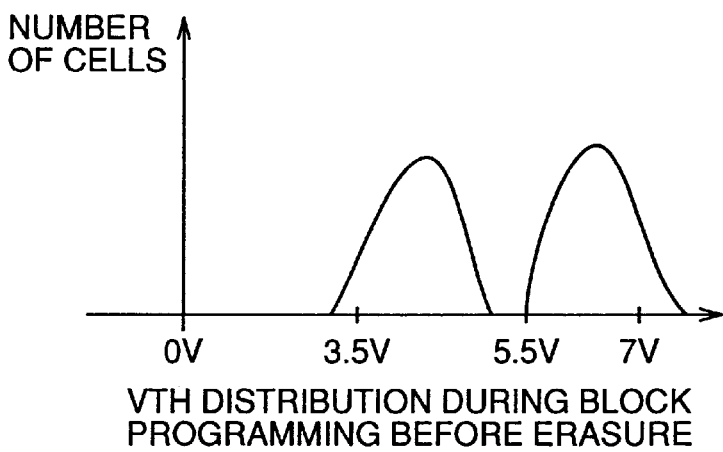
FIG. 41 shows a distribution of the threshold voltages of the memory transistor during the block program before erasure operation.
Figure 42:
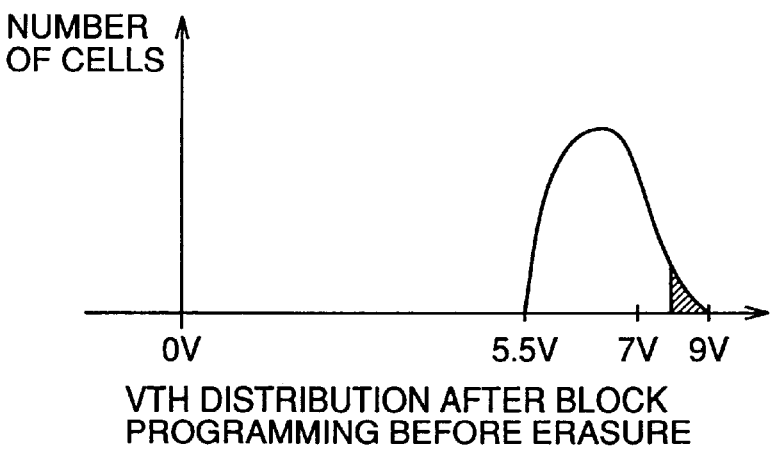
FIG. 42 shows a distribution of the threshold voltages exhibited after completion of the block program before erasure.

Referring to FIG. 2, an erase command is applied in step S1. In subsequent step S40, block program before erasure is executed by using an FN tunnel current for performing programming on a block by block basis. For this block program before erasure, a voltage already described in FIG. 38 is applied to the memory block.

The NOR type flash memory has been described as an example of the nonvolatile semiconductor memory device of the invention. The memory transistor having the threshold voltage of VTH or more is in the state where "0" is held. For example, VTH is 5.5 V. The memory transistor having the threshold voltage of VTL or less is in the state where "1" is held. For example, VTL is 3.5 V.

The state of "1" corresponds to the erased state, and the state of "0" corresponds to the programmed state. The change from the state of "1" to the state of "0" is referred to as "program" or "programming".

Figure 22:
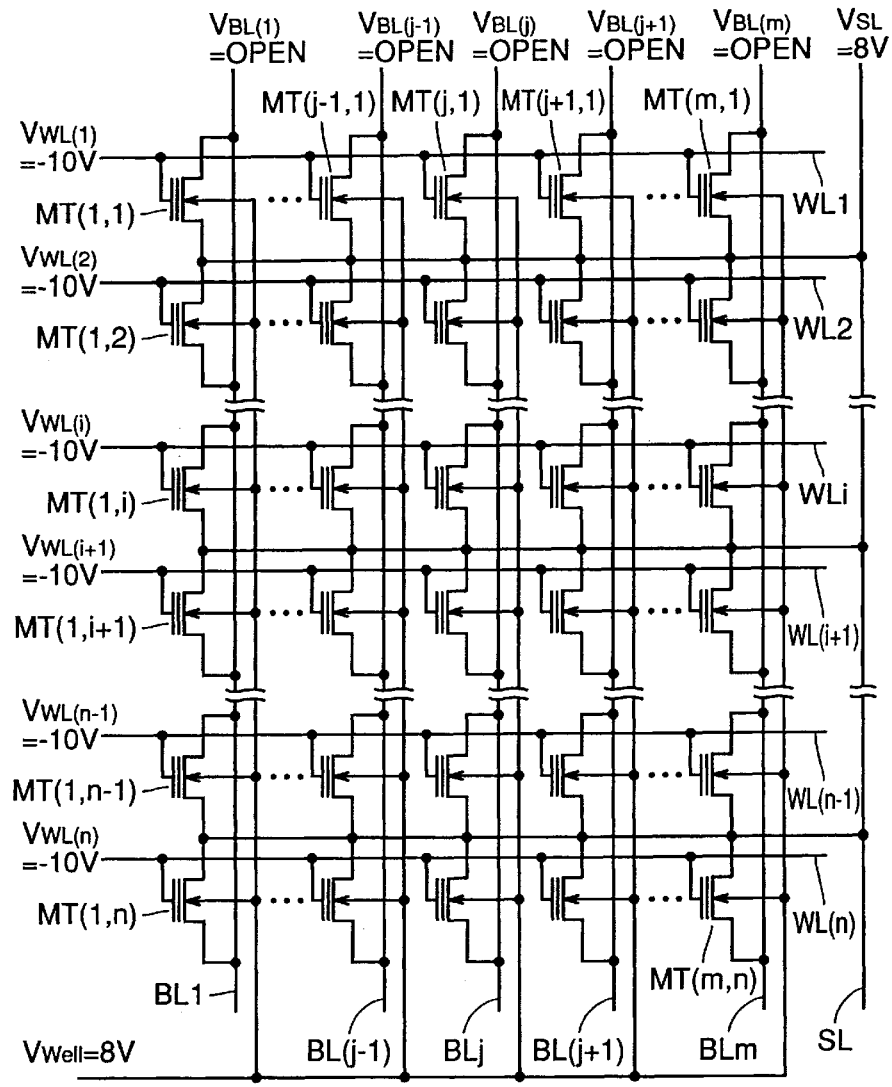
FIG. 22 is a circuit diagram of a memory block for showing voltages applied when an erase pulse is applied in step S102 shown in FIG. 21.
Figure 23:
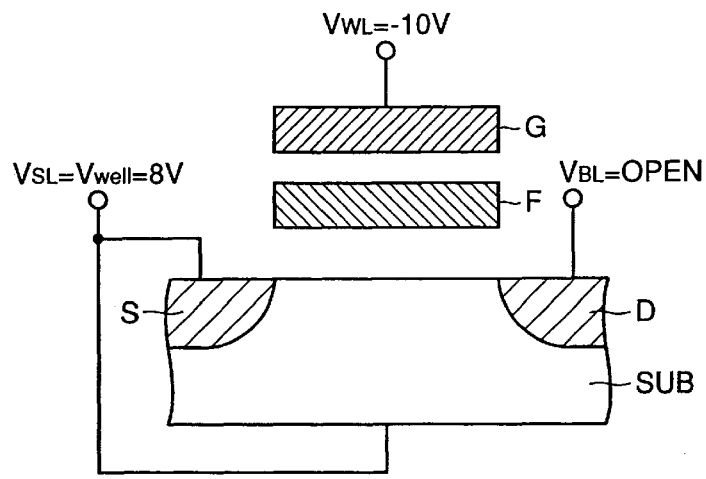
FIG. 23 shows voltages applied to the memory transistor when the erase pulse is applied.

Referring to FIG. 2 again, an erase pulse having a predetermined pulse width is applied for performing erasure on a block by block basis using the FN tunnel current in step S41. When applying this erase pulse, a voltage, e.g., shown in FIG. 22 is applied to the memory block.

Figure 24:
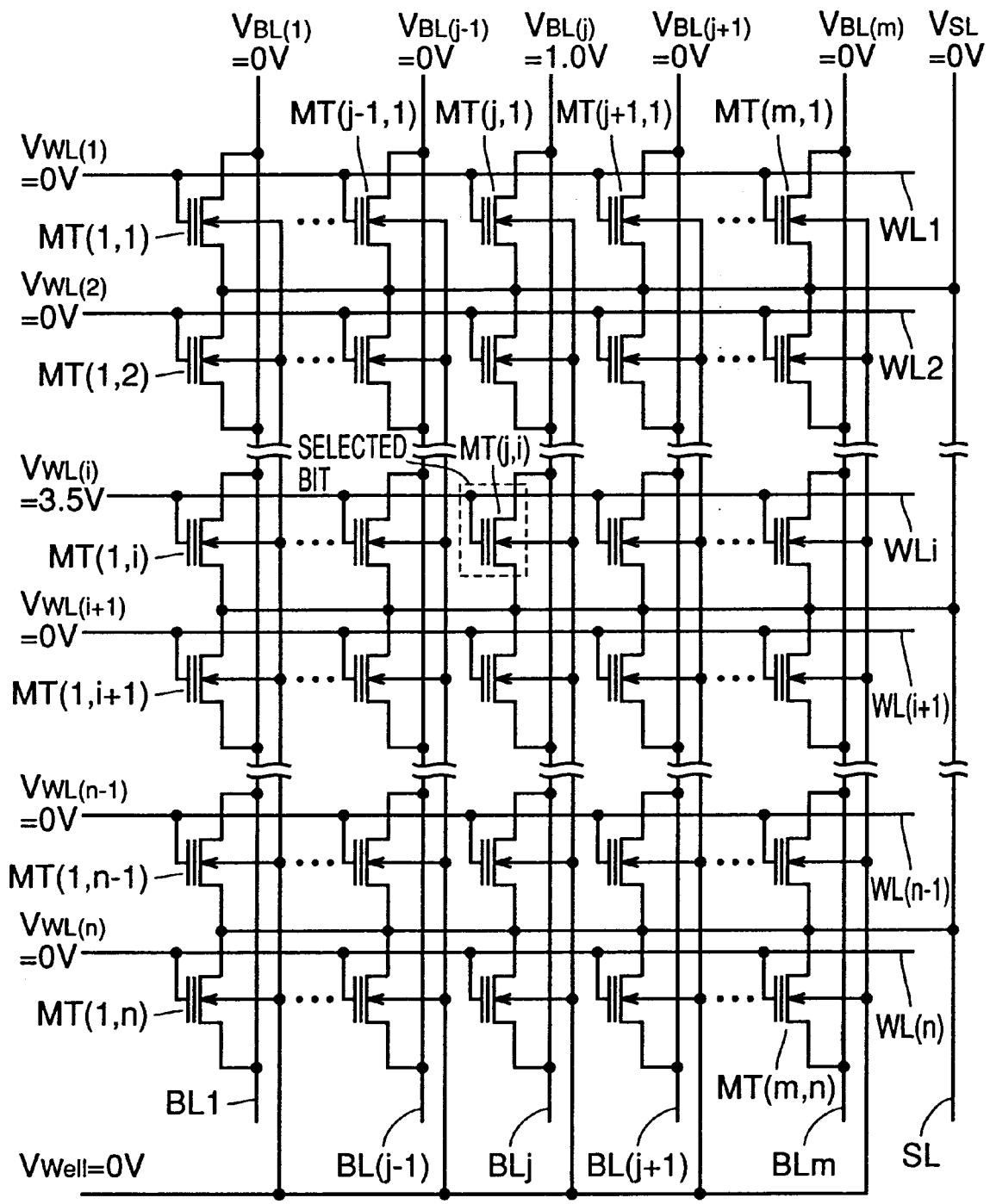
FIG. 24 is a circuit diagram showing voltages which are applied when the erase verify is performed in step S103 of the sequence shown in FIG. 21.
Figure 25:
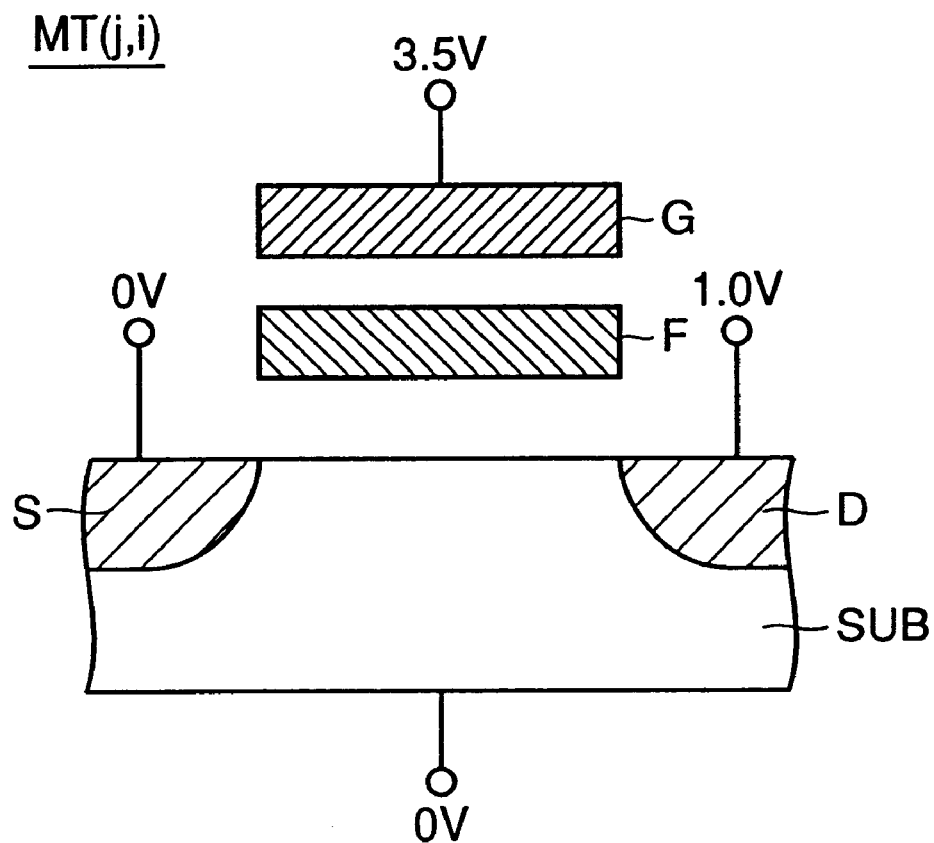
FIG. 25 shows voltages applied to the memory transistor corresponding to a selected bit in FIG. 24.
Figure 26:
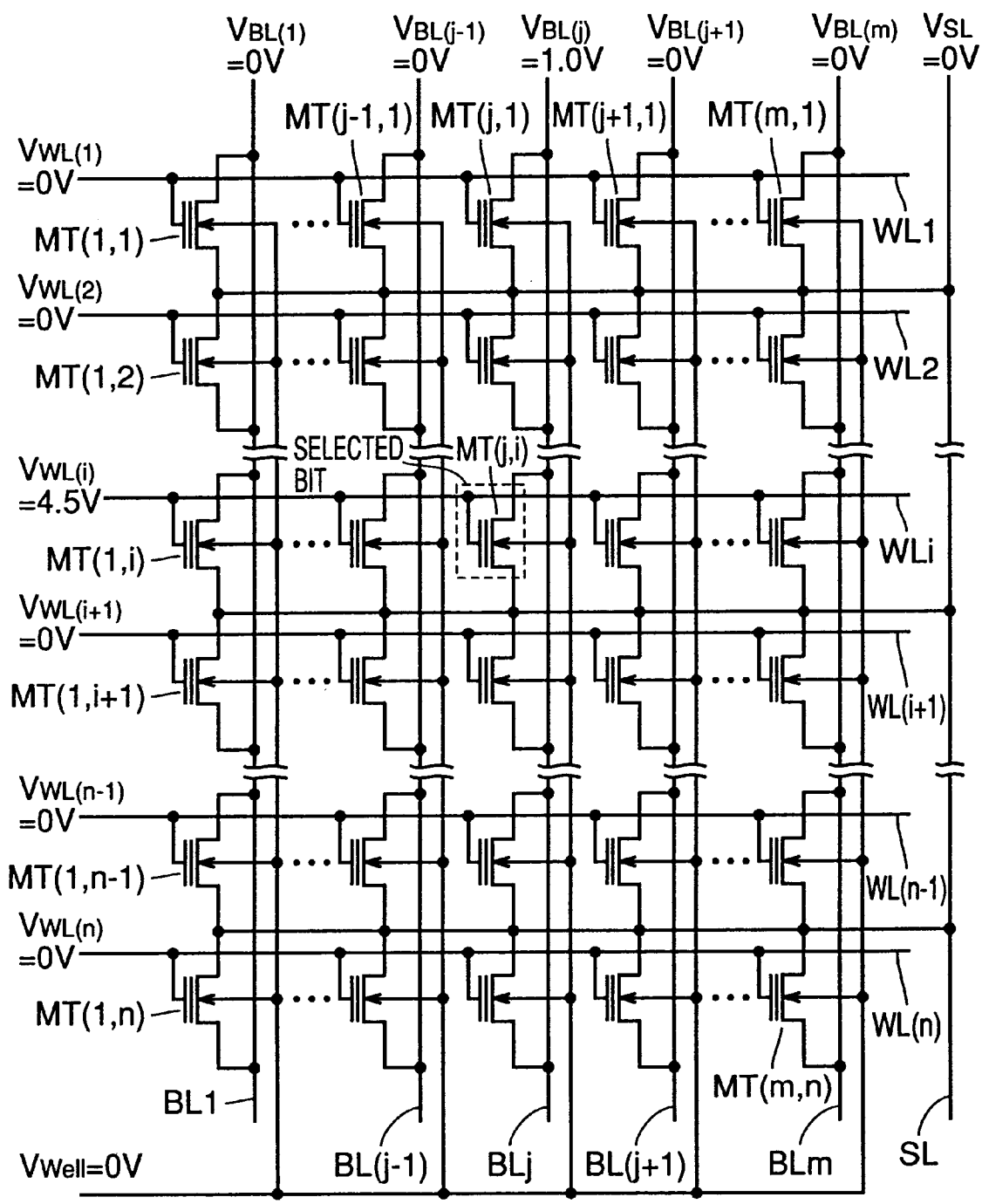
FIG. 26 is a circuit diagram showing voltage setting in a read operation of a flash memory in the prior art.
Figure 27:
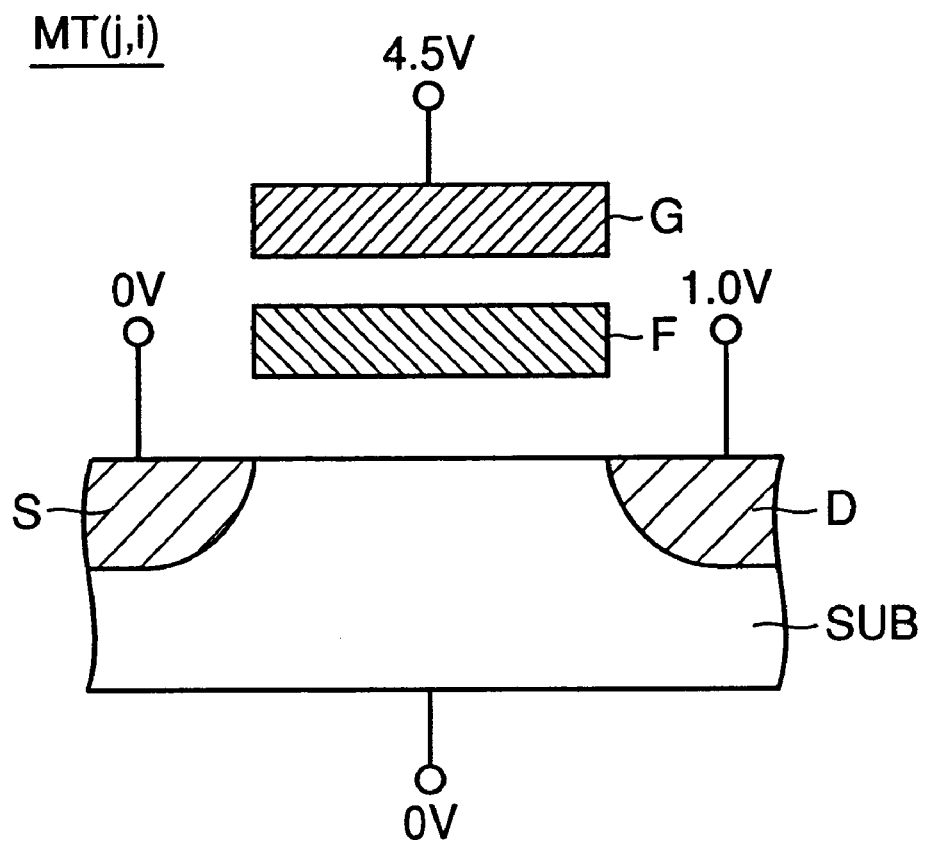
FIG. 27 shows potentials applied to the memory transistor which is selected in the read operation shown in FIG. 26.
Figure 28:
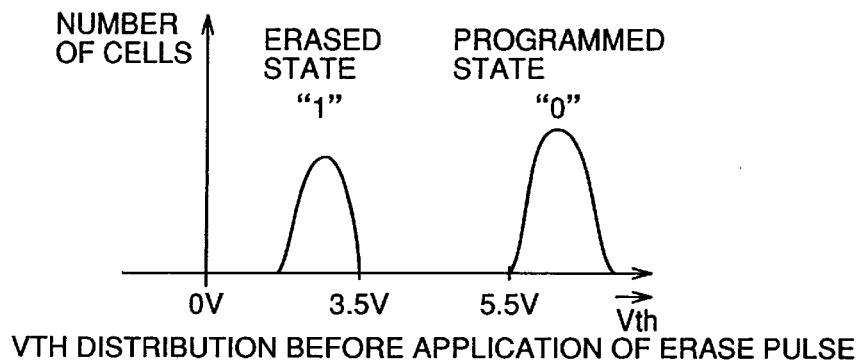
FIG. 28 shows a distribution of threshold voltages before application of the erase pulse.
Figure 29:
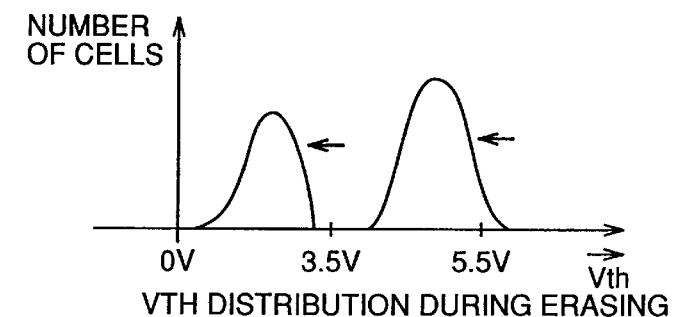
FIG. 29 shows an incompletely erased state where data of all bits are not completely erased although the erase pulse is applied in the erase sequence shown in FIG. 21.
Figure 30:
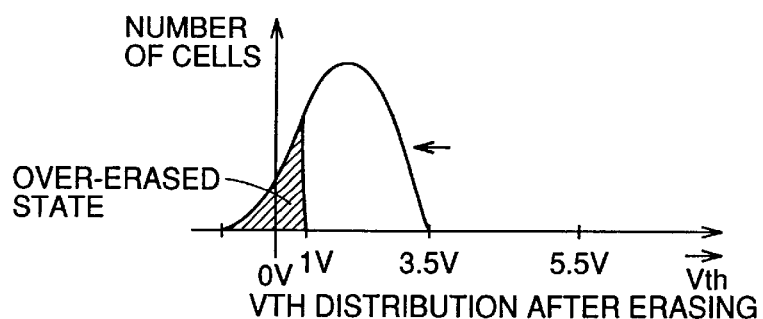
FIG. 30 shows a distribution of the threshold voltages exhibited when the erase verify in step S103 shown in FIG. 21 is passed.
Figure 31:
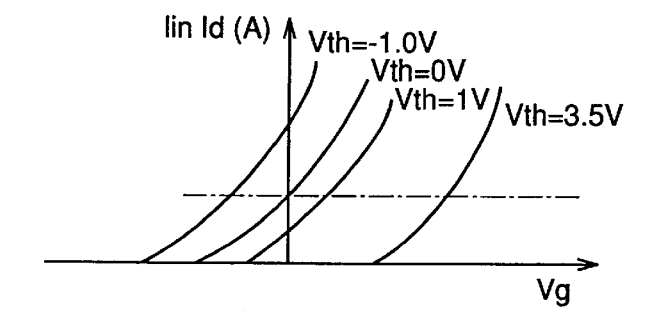
FIG. 31 shows characteristics of gate voltages and drain currents of the memory transistors having various threshold voltages in the erased state.

In step S42, the erase verify is performed for verifying that data of all the memory transistors in the memory block is erased. In this erase verify operation, a voltage, e.g., shown in FIG. 24 is applied to the memory block.

When the erase verify in step S42 is passed, the block program before erasure for performing the block program on a block by block basis with the FN tunnel current is performed again in step S43.

In subsequent step S44, the erase pulse of the predetermined pulse width is applied again for performing the erasure on a block by block basis with the FN tunnel current.

In step S46, the erase verify is performed again for verifying that data of all the memory transistors in the memory block is erased.

If the erasing is not completed, the processing returns to step S44 for applying the erase pulse.

Figure 33:
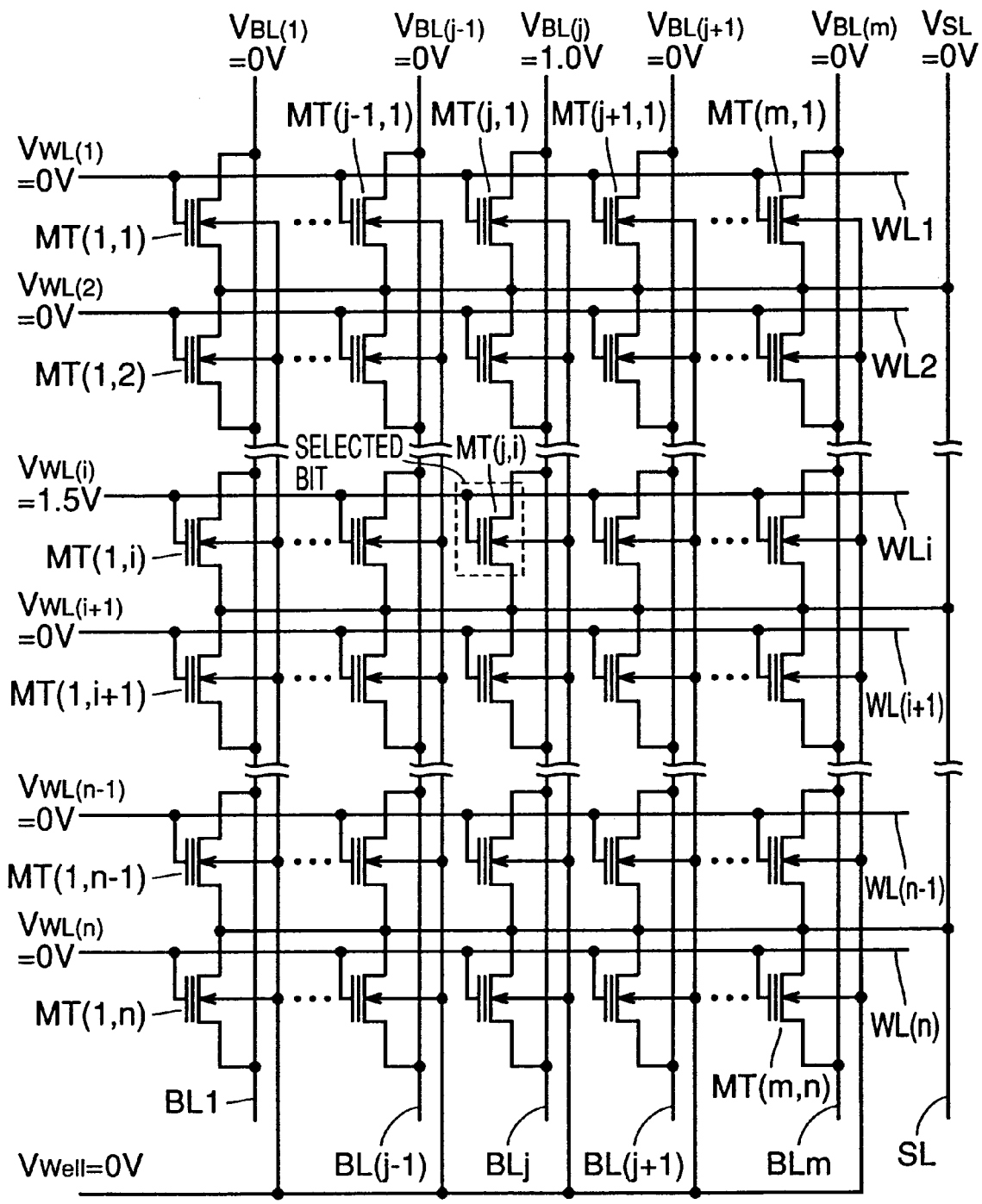
FIG. 33 is a circuit diagram showing voltages applied in the memory block during the over-erase verify executed in step S114 shown in FIG. 32.
Figure 34:
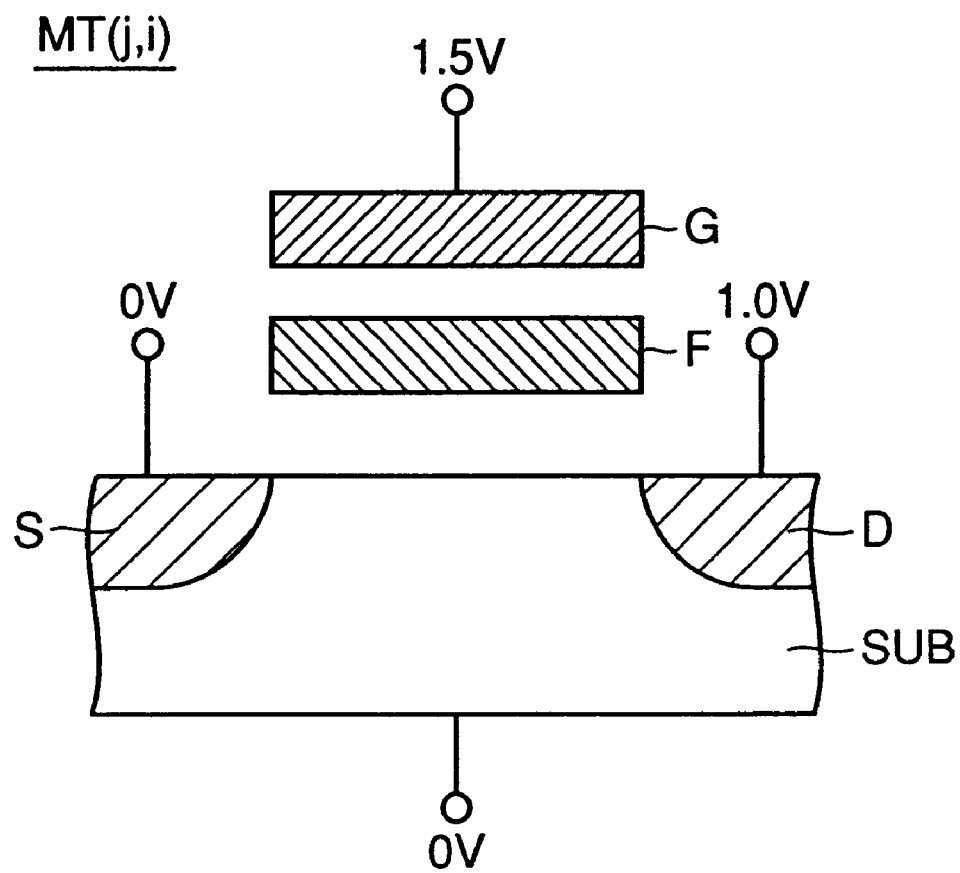
FIG. 34 shows voltages applied to the memory transistor corresponding to the selected bit in the over-erase verify operation.

When the erasing of data of the memory transistors is verified, the processing advances to step S6, and the over-erase verify is performed. In the over-erase verify, all the memory cells are determined whether they are in the over-erased state or not. For this over-erase verify, a voltage, e.g., shown in FIG. 33 is applied to the memory block.

When the memory transistor in the over-erased state is present, the processing advances to step S7, and the bit by bit over-erase recovery is performed. In the bit by bit over-erase recovery, an operation of selectively recovering the memory transistors is performed using channel hot electrons, and in other words, an operation of increasing the excessively lowered threshold voltage is performed.

Actually, reading for verify is performed by byte (8 bits) by byte or word by word (16 bits) for determining whether the over-erased state is present or not. In the recovery operation, the selection is performed byte by byte or word by word, similarly to the verify operation, and the voltage for recovery is applied to the bits which are selected to be recovered.

Figure 35:
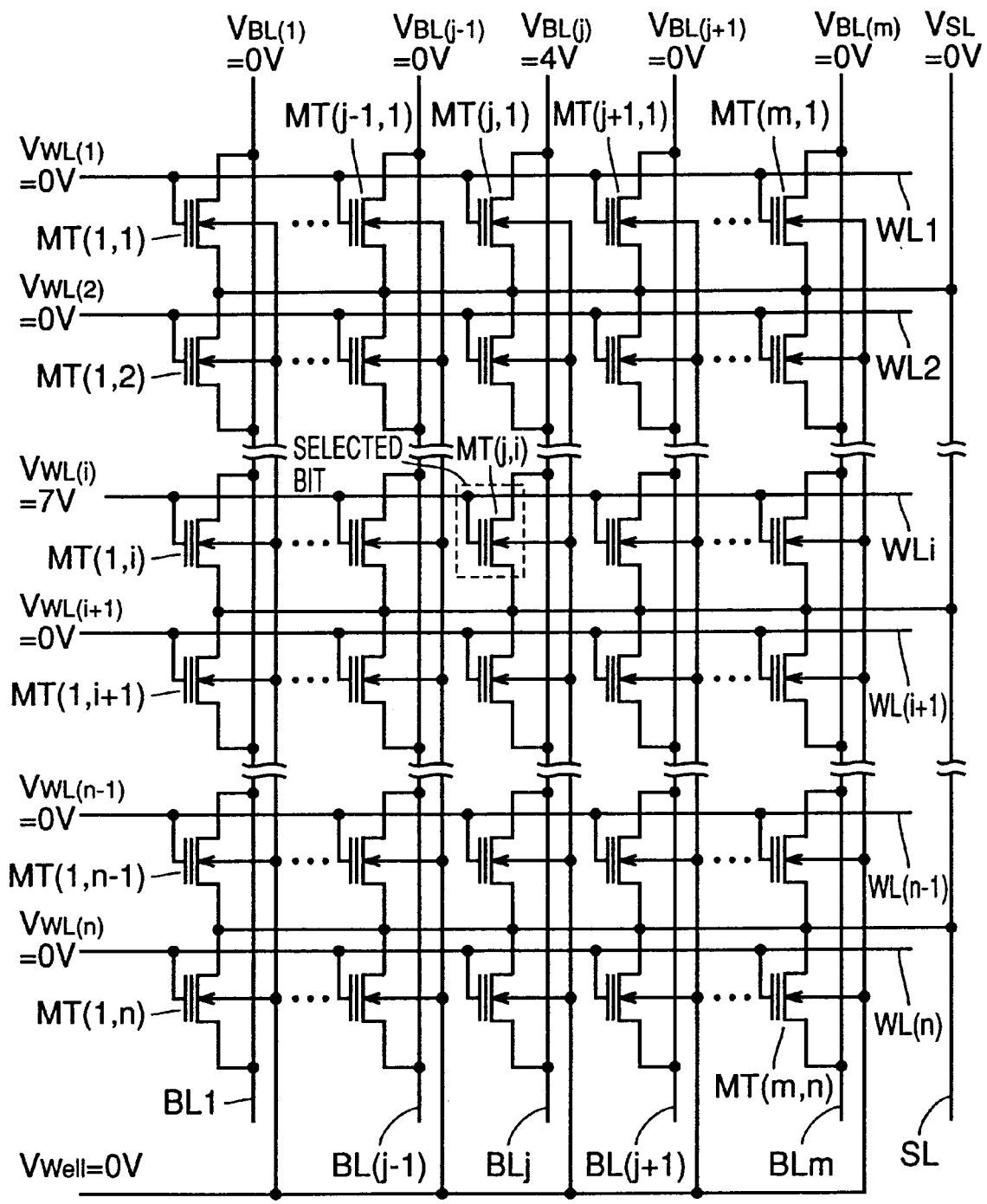
FIG. 35 is a circuit diagram showing voltages applied to the memory block in a bit by bit over-erase recovery operation in step S115 shown in FIG. 32.

For this bit by bit over-erase recovery, a voltage, e.g., shown in FIG. 35 is applied to the memory block.

Then, the processing advances to step S8 for over-erase verify. In the over-erase verify, all the memory transistors in the block are checked for the over-erased state, similarly to the step S6. When the over-erased memory transistor(s) are left, the processing returns to step S7.

If the over-erased memory transistor is not present, the processing advances to step S9, in which over-recovery verify is performed by determining whether the over-recovered memory transistor(s) are present or not. If the over-recovered transistor(s) are present, the processing returns to step S44 for applying the erase pulse.

If the over-recovered memory transistor is not present, the processing advances to step S10, and the erasing ends.

Figure 3:
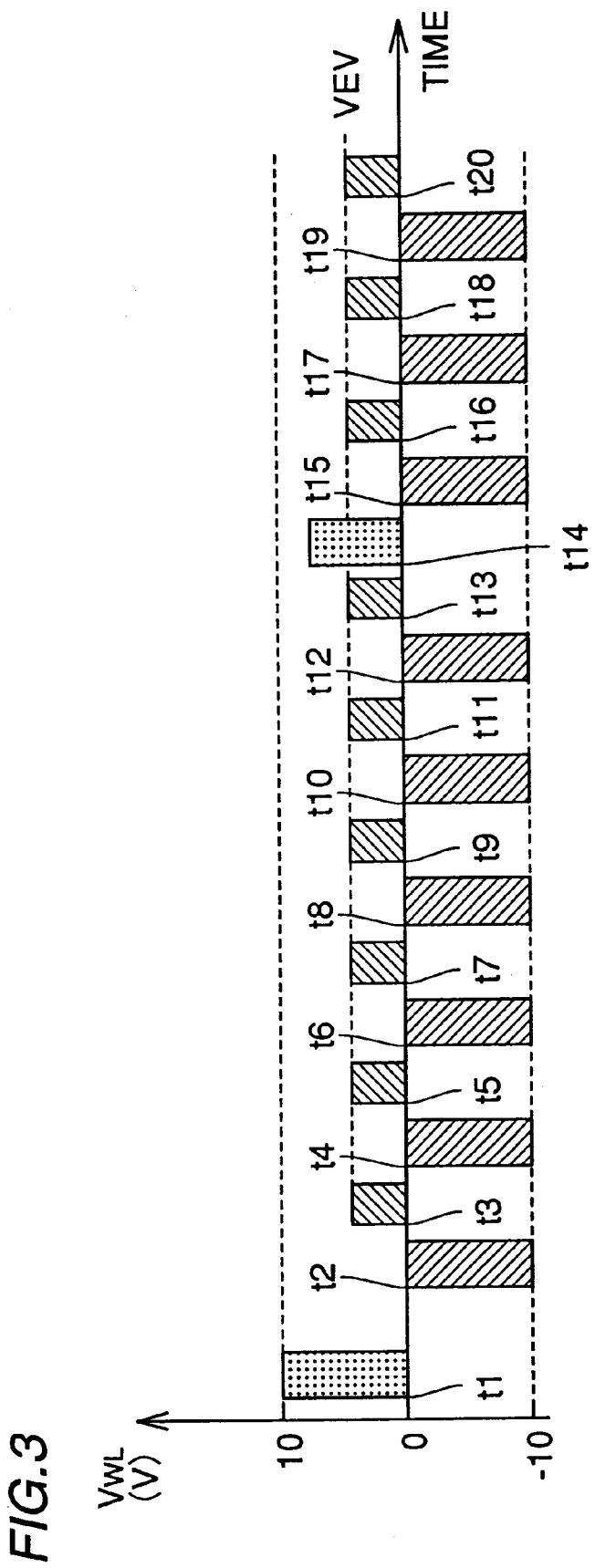
FIG. 3 is a waveform diagram showing changes in word line potential in the case where erase verify voltages in steps S42 and S46 are equal to each other in the flowchart of FIG. 2.

FIG. 3 is a waveform diagram showing changes in word line potential in the case where the erase verify potentials in steps S42 and S46 are equal to each other in the flowchart of FIG. 2.

Referring to FIGS. 2 and 3, application of the block program pulse starts at time t1 after input of the erase command in step S40.

Figure 4:
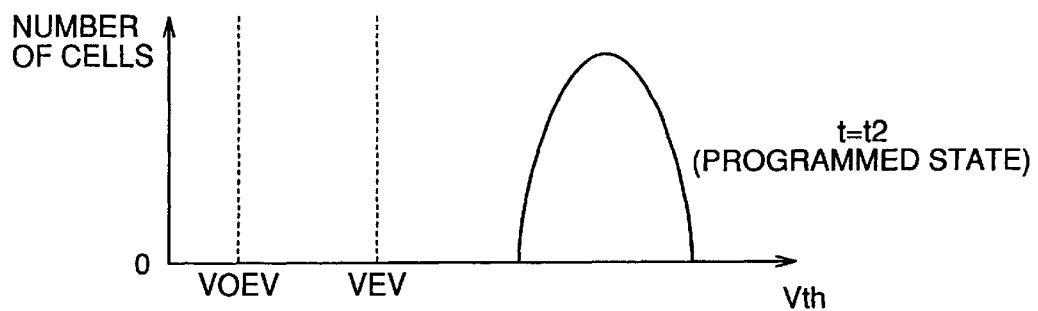
FIGS. 4–7 show a distribution of the number of memory cells with respect to the threshold voltage in a memory block at times t2, t13, t15 and t20 in FIG. 3, respectively.

FIG. 4 shows a distribution of the number of memory cells with respect to the threshold voltage in the memory block at time t2 in FIG. 3.

At time t2, as shown in FIG. 4, the memory cells are in the programmed state, and therefore have the high thresholds owing to the program pulse applied between times t1 and t2 shown in FIG. 3.

Referring to FIGS. 2 and 3 again, application of the erase pulse in step S41 starts at time t2. At time t3, erase verify is performed (step S42), and it is determined that the erasure of the memory block is not completed so that the application of erase pulse in step S41 is performed again at time t4. Thereafter, the erase verify and the application of erase pulse are repeated for a period from time t5 to time t13. At this point of time, the erase verify is equal to VEV.

In the erase verify at time t13, it is verified that the erasure of the memory block is completed (step S42).

Figure 5:
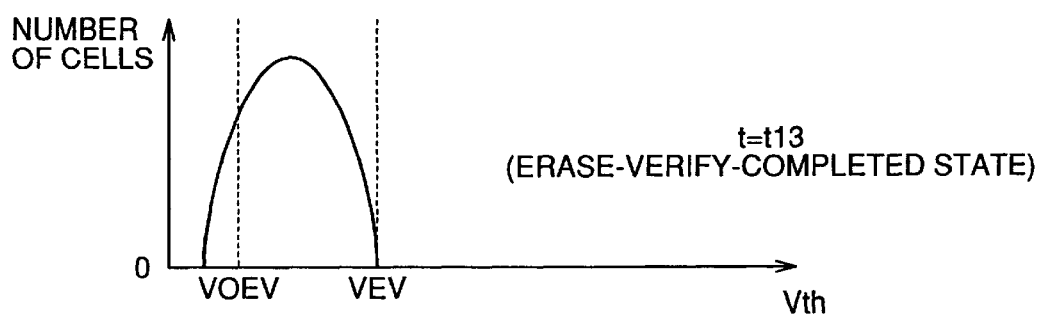

FIG. 5 shows a distribution of the number of memory cells with respect to the threshold voltage in the memory block at time t13 in FIG. 3.

At time t13, as shown in FIG. 5, the erase pulses applied between times t2 and t13 in FIG. 3 bring about such a state that the memory cells in the memory block have the threshold voltages lower than erase verify voltage VEV, and thus are in the erased state.

Figure 32:
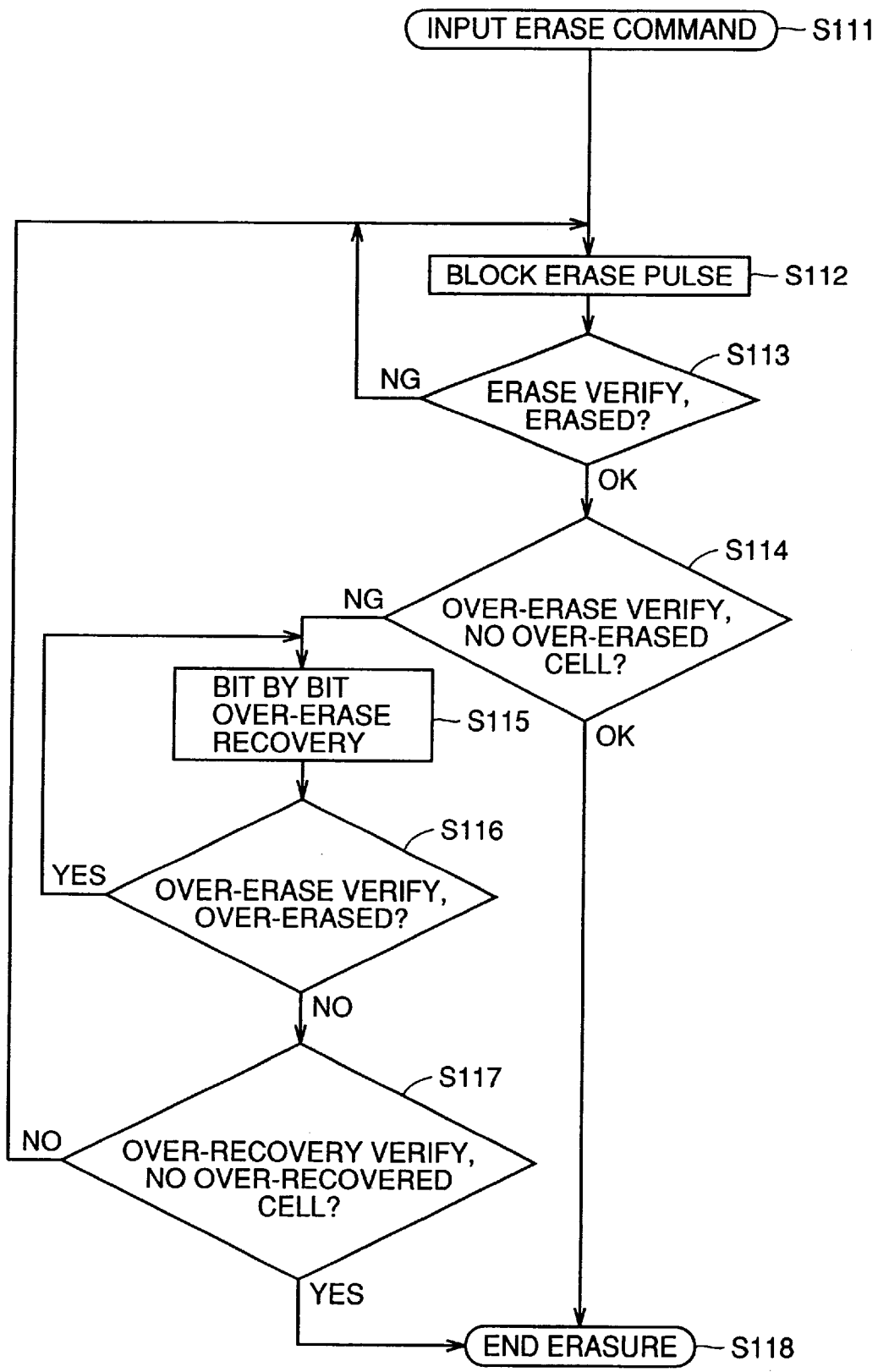
FIG. 32 is a flowchart showing a flow employing countermeasures against the problem of over-erasing of the erase sequence shown in FIG. 21.
Figure 36:
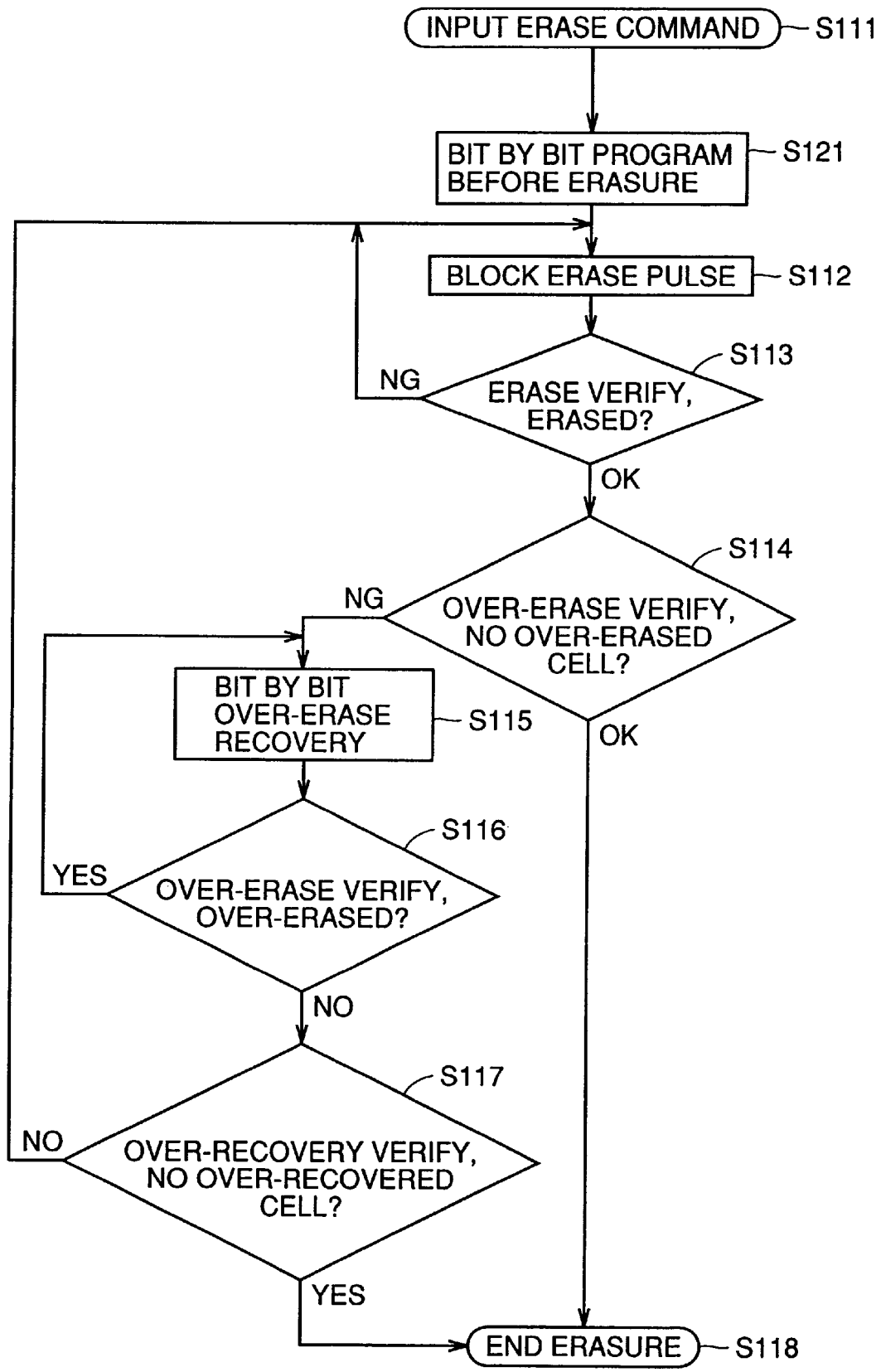
FIG. 36 is a flowchart showing an erase sequence for further reducing the erase time of the erase sequence shown in FIG. 32.
Figure 37:
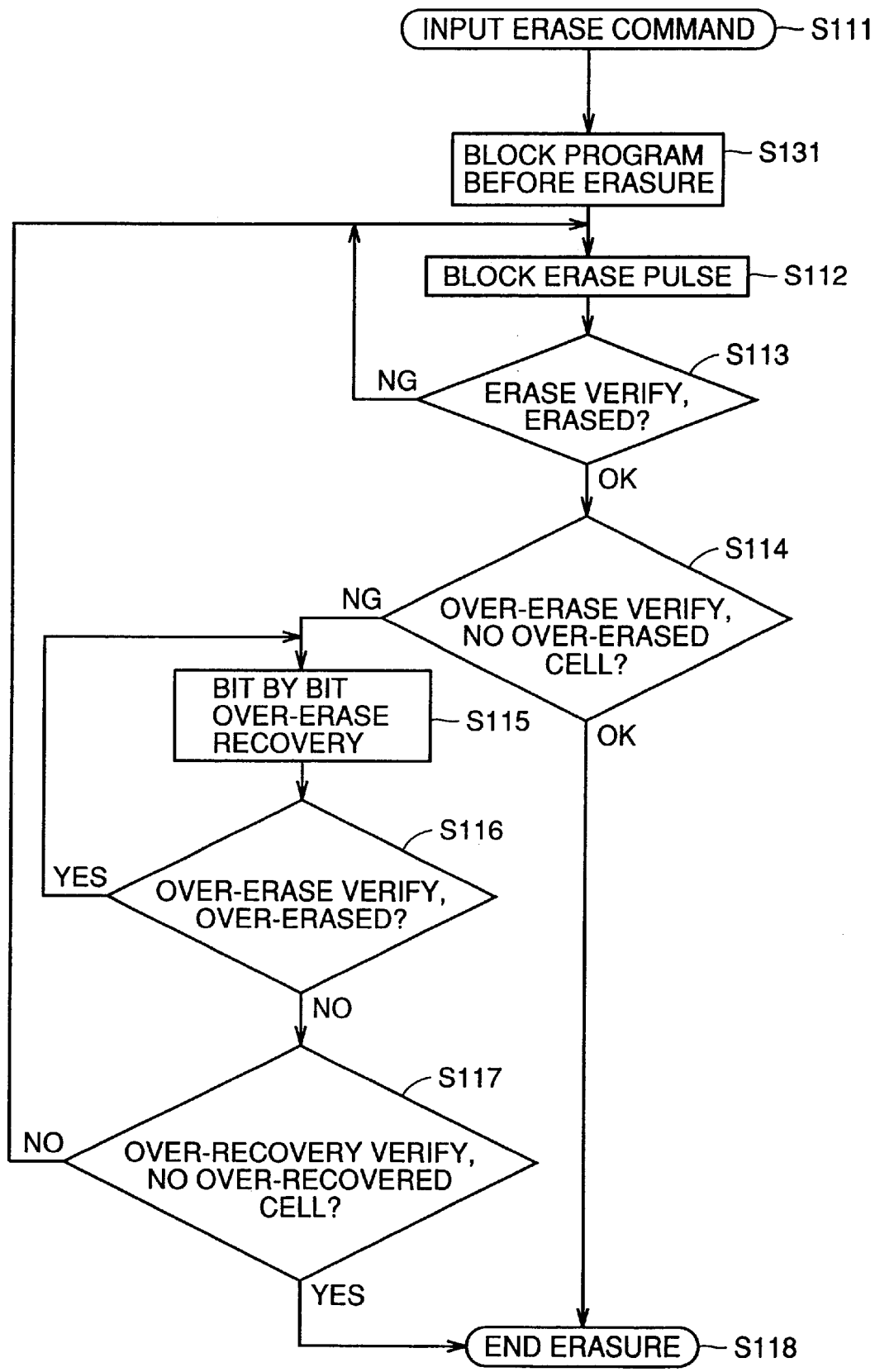
FIG. 37 is a flowchart showing an erase sequence for further reducing the erase time of the erase sequence shown in FIG. 36.

Referring to FIGS. 2 and 3 again, the block program pulse in step S43 is applied at time t14. This program pulse has a lower intensity than the program pulse applied in step S40. It is already known that the application of block program pulse in step S43 considerably narrows the distribution of the threshold voltages. For example, the memory transistors, of which threshold voltages are equal to or lower than over-erase verify voltage VOEV, are much smaller in number than those in the case of the conventional flows shown in FIGS. 32 and 36.

Figure 6:
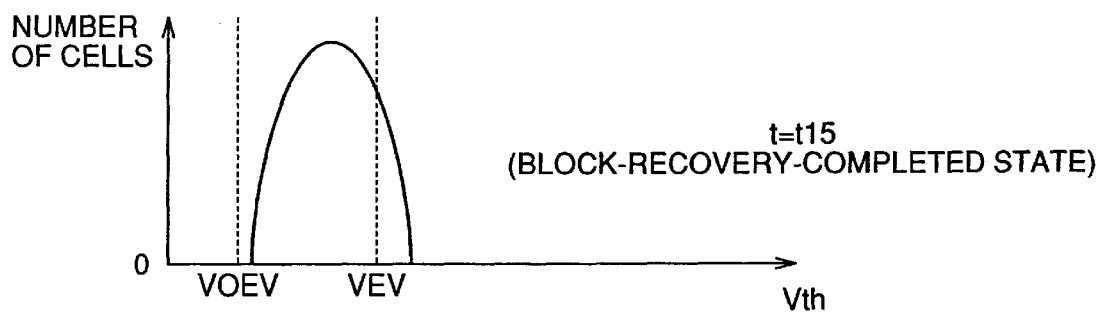

FIG. 6 shows a distribution of the number of memory cells with respect to the threshold voltage in the memory block at time t15 in FIG. 3.

Referring to FIG. 6, the block program pulse applied between times t14 and t15 in FIG. 3 brings about such a state that the memory cell in the memory block has the threshold voltage larger than over-erase verify voltage VOEV at time t15. However, some memory cells have the threshold voltages exceeding erase verify voltage VEV. Therefore, these cells must be set to the completely erased state. Naturally, such a state may occur that no memory cell has the threshold voltage exceeding erase verify voltage VEV. In this case, the erasure is completed.

Referring to FIGS. 2 and 3, the erase pulse in step S44 is applied at time t15, and the erase verify is performed at time t16. Steps S44 and S46 are repeated until the erase verify is passed (from time t17 to time t20). The erase verify voltage in step S46 is equal to the erase verify voltage in step S42, and thus is equal to VEV. It is assumed that the erasure of the memory cells is verified in erase verify at time t20.

Figure 7:
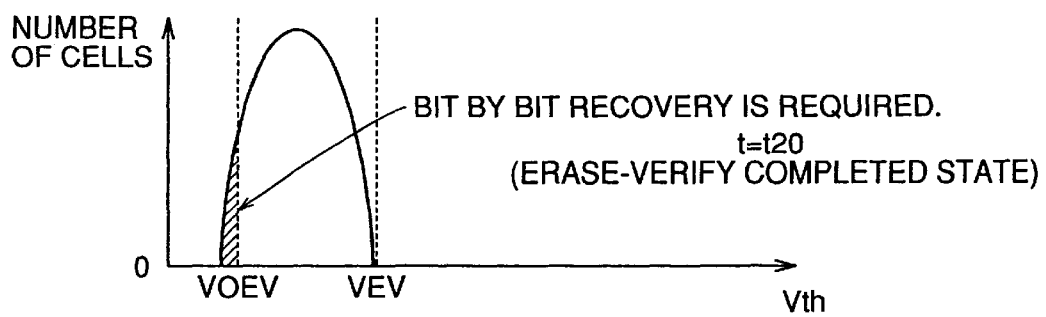

FIG. 7 shows a distribution of the number of memory cells with respect to the threshold voltage in the memory block at time t20 in FIG. 3.

Referring to FIG. 7, the erase pulses applied between times t15 and t20 in FIG. 3 bring about such a state at time t20 that the memory cells in the memory block have the threshold voltages lower than erase verify voltage VEV. However, few memory cells are still in such a state that the threshold voltage is lower than over-erase verify voltage VOEV. For such memory cells, the over-erase recovery processing in steps S7–S9 in FIG. 2 must be performed bit by bit. Naturally, the distribution of the threshold voltages is entirely contained between erase verify voltage VEV and over-erase verify voltage VOEV in some cases. The erasure is completed in such cases.

However, the over-erase recovery operation performed bit by bit as well as the verify thereof require a long time as already described in connection with the prior art. Therefore, the total erase time can be reduced as the memory cells to be processed decrease in number.

Figure 8:
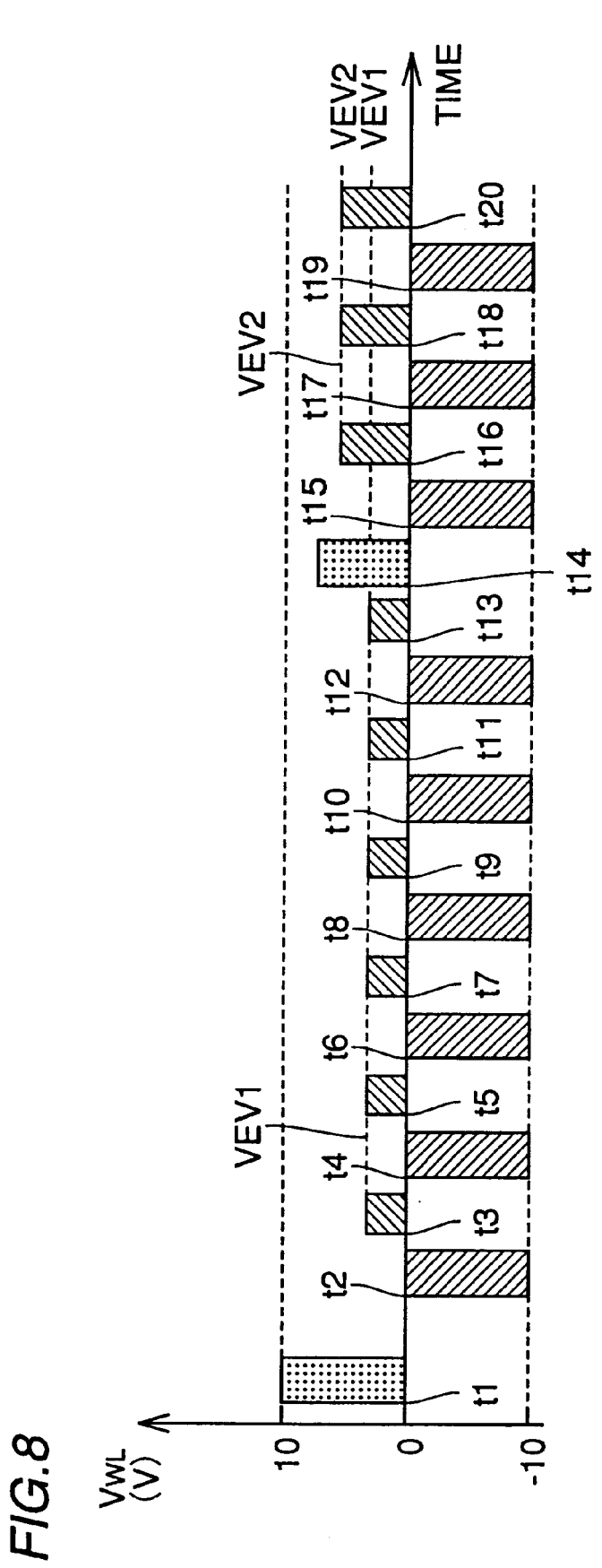
FIG. 8 is a waveform diagram showing changes in word line potential in the case where a difference is set between the erase verify voltages in steps S42 and S46 in the flowchart of FIG. 2 for further reducing an erase time.

FIG. 8 is a waveform diagram showing changes in word line potential in the case where the erase time is reduced by providing a difference between the erase verify voltages in steps S42 and S46.

In the waveform diagram of FIG. 8, an erase verify voltage VEV2 which is applied between times t16–t20 for step S46 is larger than an erase verify voltage VEV1 applied to the word line between times t3 and t14 for step S41. In this point, the waveform in FIG. 8 differs from that in FIG. 3, in which the verify voltages in steps S41 and S46 are both equal to erase verify voltage VEV.

Referring to FIGS. 2 and 8, application of the block program pulse, which is performed in step S40 after input of the erase command, starts at time t1.

Figure 9:
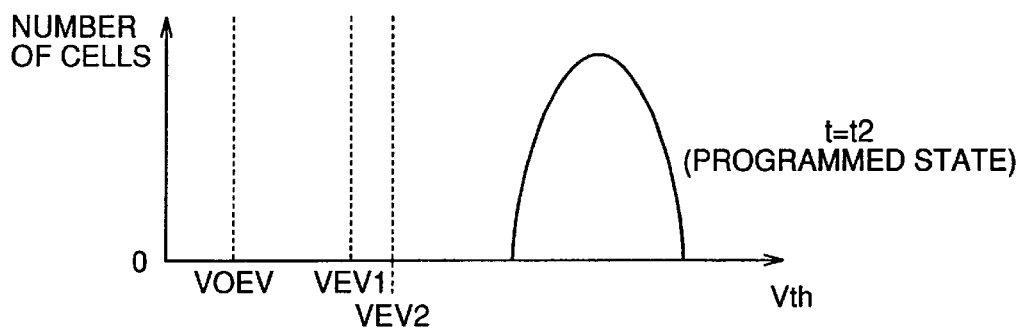
FIGS. 9–12 show a distribution of the number of memory cells with respect to the threshold voltage in a memory block at times t2, t13, t15 and t20 in FIG. 8, respectively.

FIG. 9 shows a distribution of the number of memory cells with respect to the threshold voltage in the memory block at time t2 in FIG. 8.

At time t2, as shown FIG. 9, the memory cells are in the programmed state owing to the program pulse applied between times t1 and t2 shown in FIG. 8, and therefore the threshold of the memory cell is high.

Referring to FIGS. 2 and 8 again, application of the erase pulse in step S41 starts at time t2. At time t3, erase verify is performed (step S42), and it is determined that the erasure of the memory block is not 20 completed so that the application of erase pulse in step S41 is performed again at time t4. Thereafter, the erase verify and the application of erase pulse are repeated for a period from time t5 to time t13. At this point of time, the erase verify voltage is equal to VEV1.

In the erase verify at time t13, it is verified that the erasure of the memory block is completed (step S42).

Figure 10:
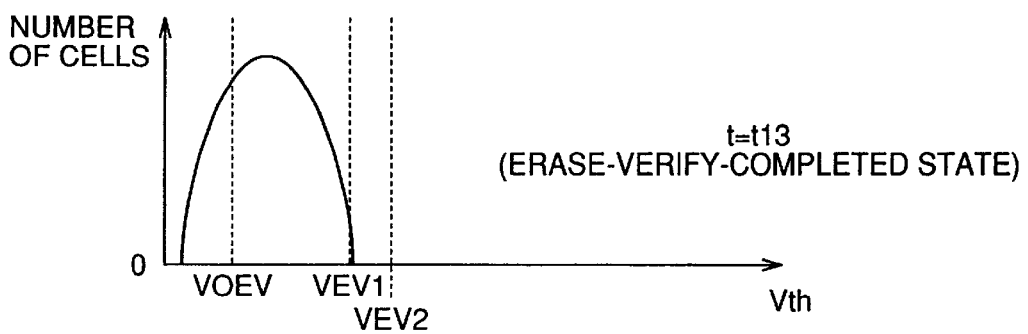

FIG. 10 shows a distribution of the number of memory cells with respect to the threshold voltage in the memory block at time t13 in FIG. 8.

At time t13, as shown in FIG. 10, the erase pulses applied between times t2 and t13 in FIG. 8 bring about such a state that the memory cells in the memory block have the threshold voltages lower than erase verify voltage VEV1, and thus are in the erased state.

Referring to FIGS. 2 and 8 again, the block program pulse in step S43 is applied at time t14. This program pulse has a lower intensity than the program pulse applied in step S40.

Figure 11:
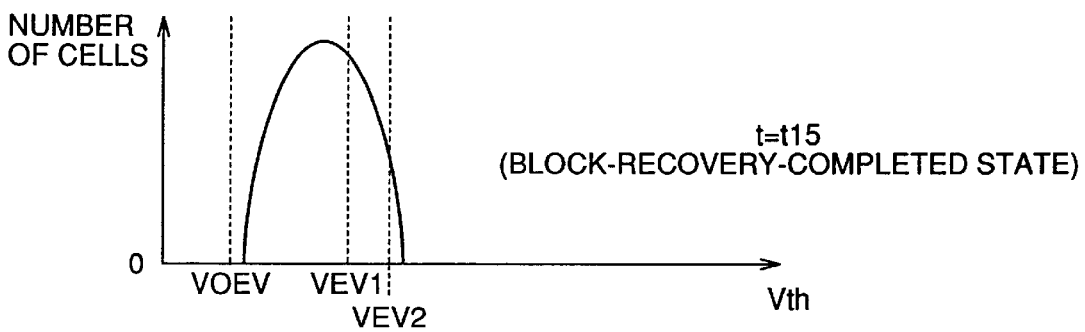

FIG. 11 shows a distribution of the number of memory cells with respect to the threshold voltage in the memory block at time t15 in FIG. 8.

Referring to FIG. 11, the block program pulse applied between times t14 and t15 in FIG. 8 brings about such a state that the memory cell in the memory block has the threshold voltage larger than over-erase verify voltage VOEV at time t15. However, some memory cells have the threshold voltages exceeding erase verify voltage VEV2. Therefore, these cells must be set to the completely erased state. Naturally, such a state may occur that no memory cell has the threshold voltage exceeding erase verify voltage VEV. In this case, the erasure is completed.

Referring to FIGS. 2 and 8, the erase pulse in step S44 is applied at time t15, and the erase verify is performed at time t16. Erase verify voltage VEV2 for this erase verify is set larger than erase verify voltage VEV1 in step S42. Thereby, it can be expected that the erase verify can be completed earlier than the case of employing the voltage of the waveform shown in FIG. 3.

Steps S44 and S46 are repeated until the erase verify is passed (from time t17 to time t20). It is assumed that the erasure of the memory cells is verified in erase verify at time t20.

Figure 12:
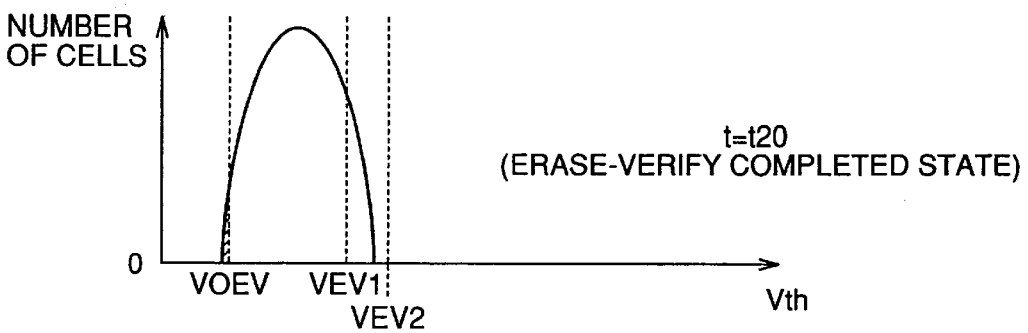

FIG. 12 shows a distribution of the number of memory cells with respect to the threshold voltage in the memory block at time t20 in FIG. 8.

Referring to FIG. 12, the erase pulses applied between times t15 and t20 in FIG. 8 bring about such a state at time t20 that the memory cells in the memory block have the threshold voltages lower than erase verify voltage VEV2. It can be expected that the number of erase pulses, which are applied until attaining the above state, is smaller than that in the case where the erase verify voltages in steps S42 and S46 are equal to each other.

The possibility that the distribution of the threshold voltages is completely contained between VEV and VOEV is larger than that in the case of applying the waveform in FIG. 3. Therefore, the possibility of completion of the erasing at this point of time is increased.

Accordingly, the memory cells requiring the over-erase recovery operation on a bit by bit basis and the verify thereof are further reduced in number, and such a case that the over-erase recovery operation itself is not required occurs more times. Therefore, the total erase time is reduced.

Modification of First Embodiment

Figure 13:
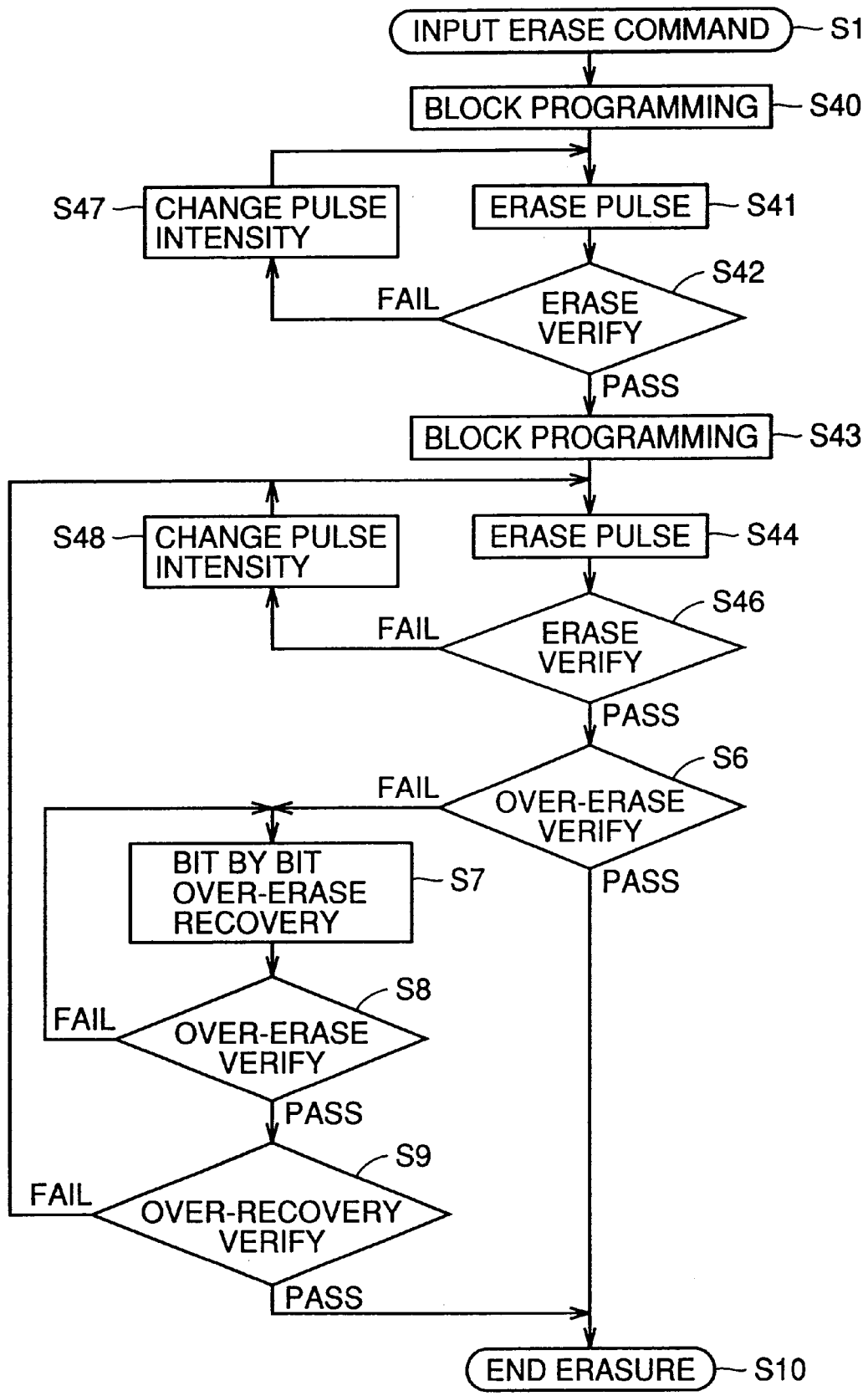
FIG. 13 is a flowchart showing an erase sequence of a modification of the first embodiment.

FIG. 13 is a flowchart showing an erase sequence of the modification of the first embodiment.

The flowchart shown in FIG. 13 differs from the flowchart shown in FIG. 2 in that the flowchart in FIG. 13 includes step S47, in which the pulse intensity is changed when it is determined by the erase verify in step S42 that the erasure is incomplete, and also includes step S48, in which the pulse intensity is changed when it is determined by the erase verify in step S46 that the erasure is incomplete. Other steps are similar to those in the flowchart shown in FIG. 2, and therefore description thereof is not repeated.

Figure 14:
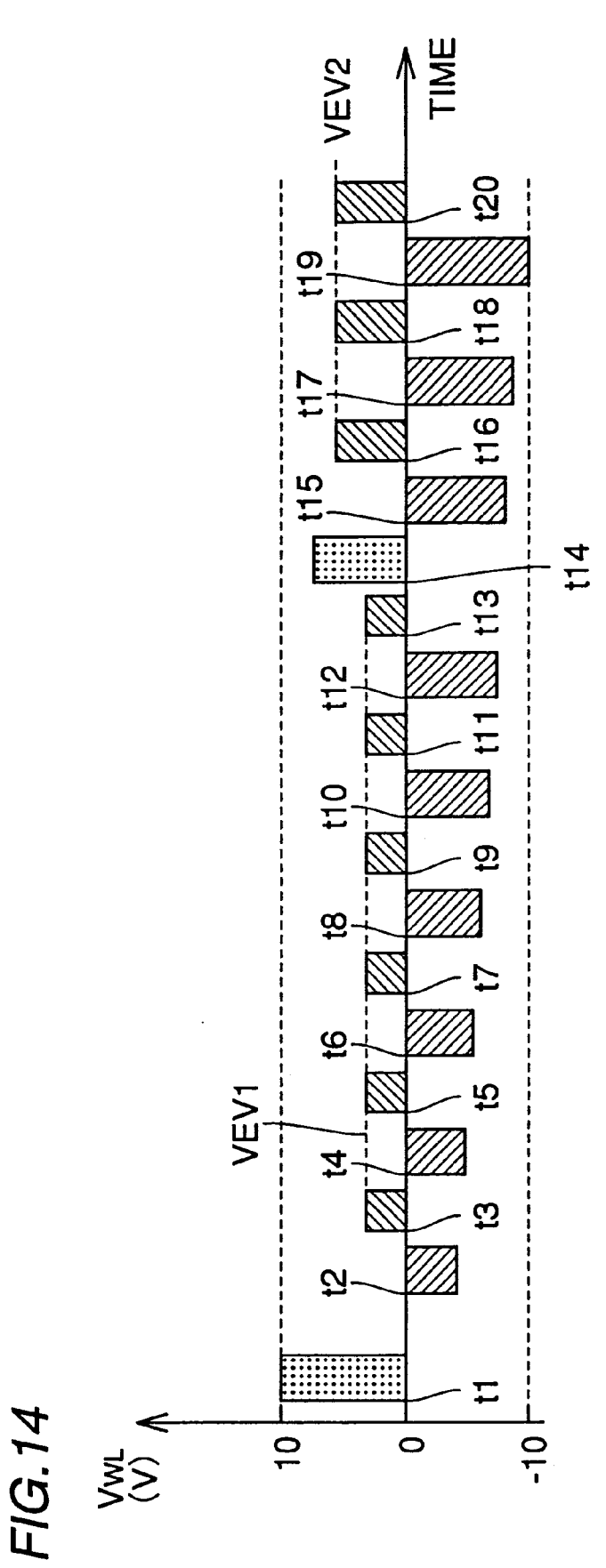
FIG. 14 is a waveform diagram showing changes in word line potential for showing an operation of the erase sequence according to the flowchart shown in FIG. 13.

FIG. 14 is a waveform diagram showing changes in word line potential for showing an operation of the erase sequence according to the flowchart shown in FIG. 13.

Referring to FIGS. 13 and 14, the intensity of the erase pulse is set small at time t2 when the erase pulse in step S41 is first applied, and is increased in step S47 every time it is determined by the erase verify in step S42 between times t2 and t14 that the erasure is incomplete.

Owing to the above manner, it is possible to reduce the time required until completion of the erase verify in step S42 while minimizing the number of over-erased memory cells. In this example of the waveform, such a modification is employed that the erase pulse in step S44, which is applied at time t15, is set to have an intensity slightly larger than that of the erase pulse applied at time t12, and that the pulse intensity is increased in step S48 between times t15 and t20 every time it is determined by the erase verify in step S46 that the erasure is incomplete. Thereby, it is possible to reduce also the time required for completing the erase verify in step S46, and further the number of memory cells, which are determined to be over-erased in step S6, can be reduced.

In the above modification of the first embodiment, erase verify voltage VEV2 in step S46 is set larger than erase verify voltage VEV1 in step S42, and thereby the erase time can be shorter than that in the case where these erase verify voltages are equal to each other.

Second Embodiment

Figure 15:
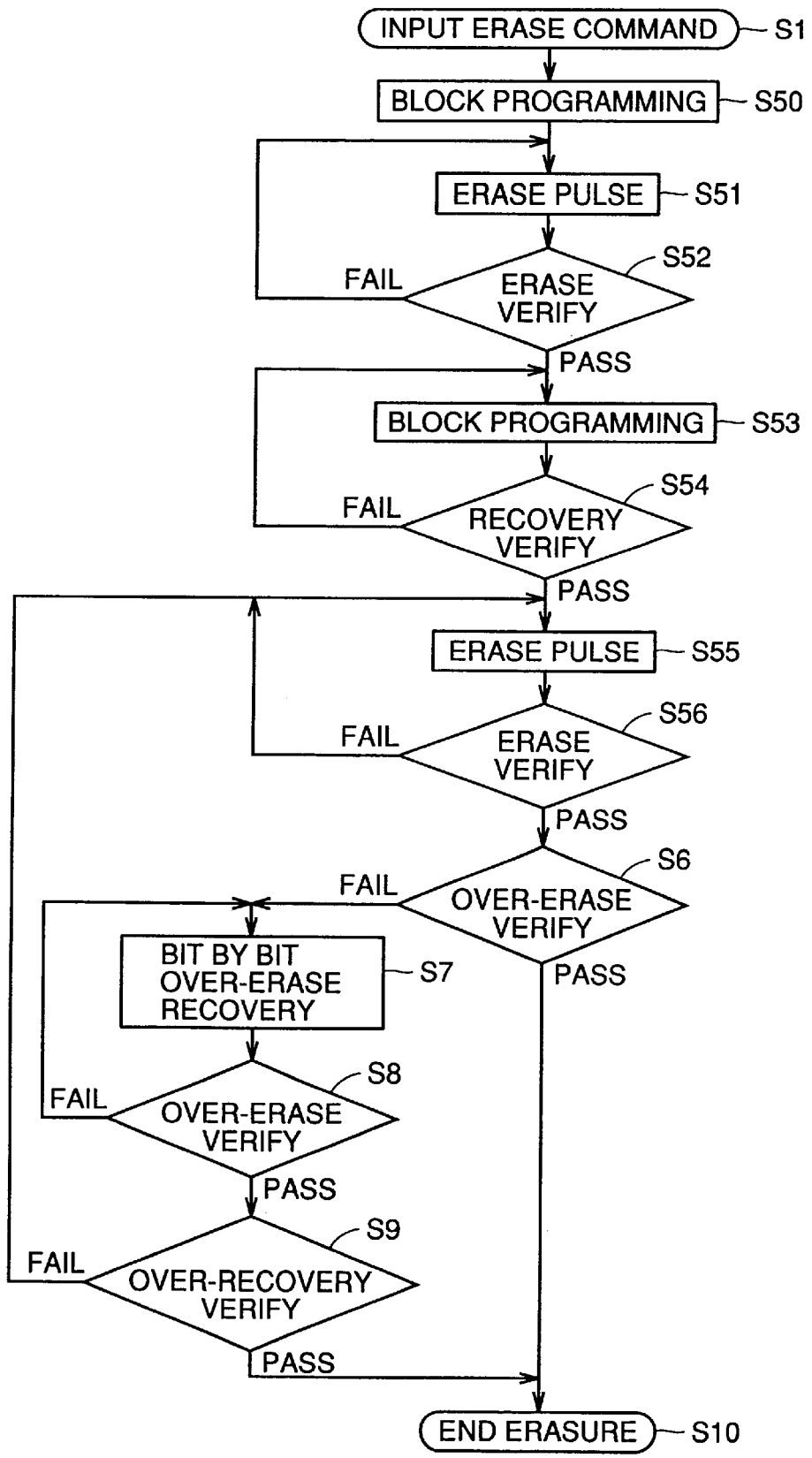
FIG. 15 is a flowchart of an erase sequence of a nonvolatile semiconductor memory device of a second embodiment.

FIG. 15 is a flowchart of the erase sequence of the nonvolatile semiconductor memory device of a second embodiment.

The flowchart shown in FIG. 15 differs from the flowchart of erase sequence of the second embodiment shown in FIG. 2 in that steps S50–S56 are employed instead of steps S40–S46. Steps S6–S10 are similar to those in the flowchart shown in FIG. 2, and therefore description thereof is not repeated.

Figure 16:
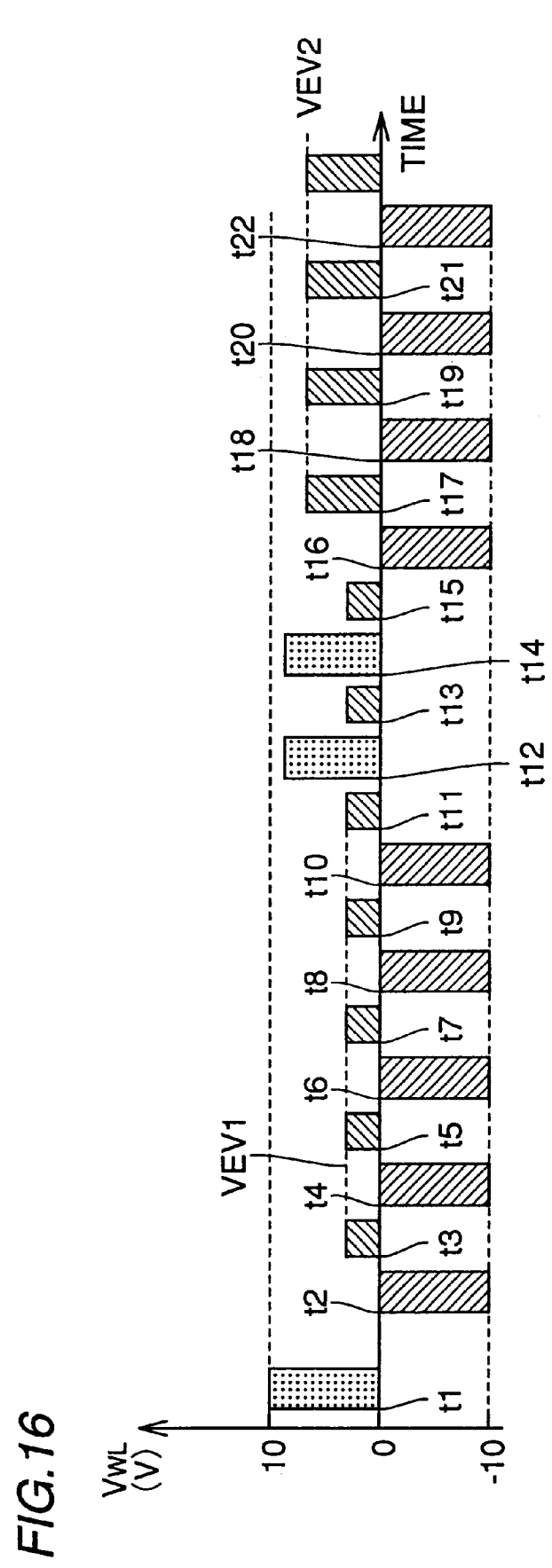
FIG. 16 is a waveform diagram showing changes in word line potential for showing the erase sequence according to the flowchart shown in FIG. 15.

FIG. 16 is a waveform diagram showing changes in word line potential for showing the erase sequence according to the flowchart shown in FIG. 15.

Referring to FIGS. 15 and 16, the erase command is applied in step S1, and the block program pulse is applied at time t1 (step S50).

At subsequent time t2, the erase pulse in step S51 is applied. For the erase verify in step S52, erase verify voltage VEV1 is applied to the word line at time t3. Thereafter, steps S51 and S52 are repeated from time t4 to time t12.

When it is verified by the erase verify at time t11 that the threshold voltage becomes equal to or lower than erase verify voltage VEV1, the processing advances to step S53, and the block program pulse is applied at time t12. At time t13, the recovery verify in step S54 is performed. In this operation, a program verify voltage lower than erase verify voltage VEV1 is applied to the word line.

When the recovery verify is completed at time t15, the erase pulse in step S55 is applied at time t16. The application of the erase pulse in step S55 is repeated until the erase verify in step S56 is completed. However, erase verify voltage VEV2 in step S56 is larger than erase verify voltage VEV1.

As described above, the erasure is completed in steps S51 and S52. In steps S53 and S54, it is verified that recovery is effected on the over-erased memory transistors. In steps S55 and S56, it is verified again that the erasure of the memory transistors in the memory block is completed. According to the above manner, the distribution width of the threshold voltage of the memory transistors in the memory block can be narrowed more reliably, and it is possible to reduce the number of memory transistors, which requires the over-erase recovery on a bit by bit basis in step S6, so that the erase time can be reduced as a whole.

Further, the determination conditions for the recovery verify in step S54 can be determined based on the number of memory transistors, as described below.

Usually, the program pulse is applied to the memory block, and it is determined that the recovery verify is completed when the memory transistor in the over-erased state having the threshold voltage smaller than erase verify voltage VEV2 is not present in the memory block.

In contrast to the above, the number of over-erased memory transistors may be determined for determining that the recovery verify is completed when the number of over-erased memory transistors is smaller than the predetermined number.

For example, it is assumed that the over-erase recovery of the memory cell in steps S7–S9 takes abut 10 microseconds per bit. In this case, a processing time of 100 milliseconds is required if the memory cells of 10,000 bits are in the over-erased state after the usual erasing operation. If the predetermined number in the determination conditions in step S54 is equal to 100 bits, the memory transistors of up to 100 bits in the over-erased state are allowed, and the processing time for the over-erase recovery decreases by 1 millisecond.

Thus, even if the processing in step S54 is curtailed only to a certain extent, this is sufficiently effective for reduction in total erase time. In view of the time required for recovery of all the over-erased memory cells, therefore, the processing in step S54 may be configured to allow a predetermined number of over-erased memory transistors.

According to the erase flow in the second embodiment described above, erase verify voltage VEV2 in step S56 is set larger than erase verify voltage VEV1 in step S52. Therefore, the erase time can be reduced as compared with the case, in which these erase verify voltages are equal to each other.

Modification of Second Embodiment

Figure 17:
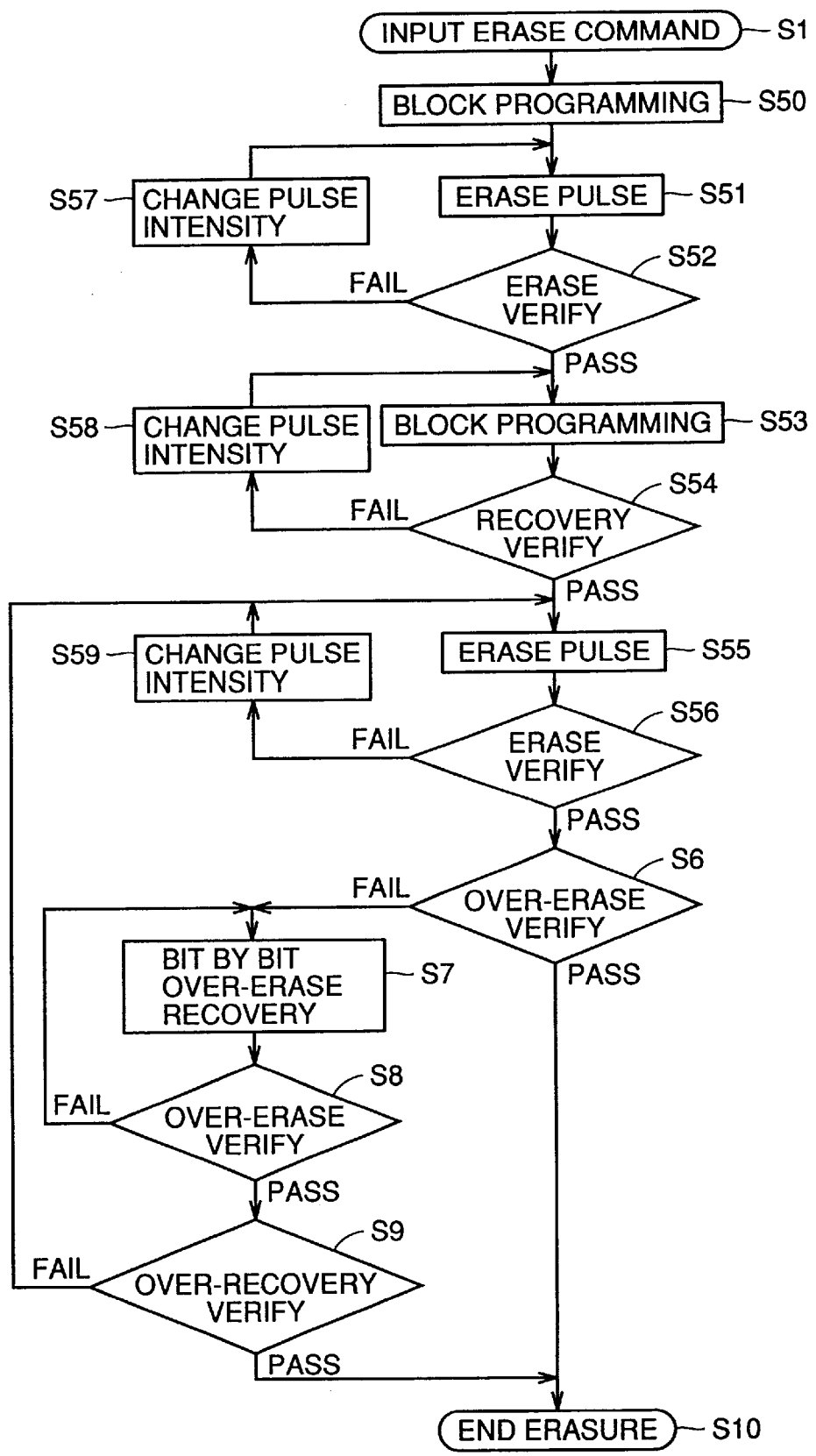
FIG. 17 is a flowchart showing a modification of the second embodiment.

FIG. 17 is a flowchart of a modification of the second embodiment.

In addition to the manners of the flowchart in FIG. 15, the flowchart in FIG. 17 further includes step S57 of changing the pulse intensity when it is determined in step S52 that the erasure is incomplete, step S58 of changing the pulse intensity when it is determined in step S54 that the recovery is incomplete, and step S59 of changing the pulse intensity when it is determined in step S56 that the erasure is incomplete. Other manners are similar to those in the flowchart shown in FIG. 15, and therefore description thereof is not repeated.

Figure 18:
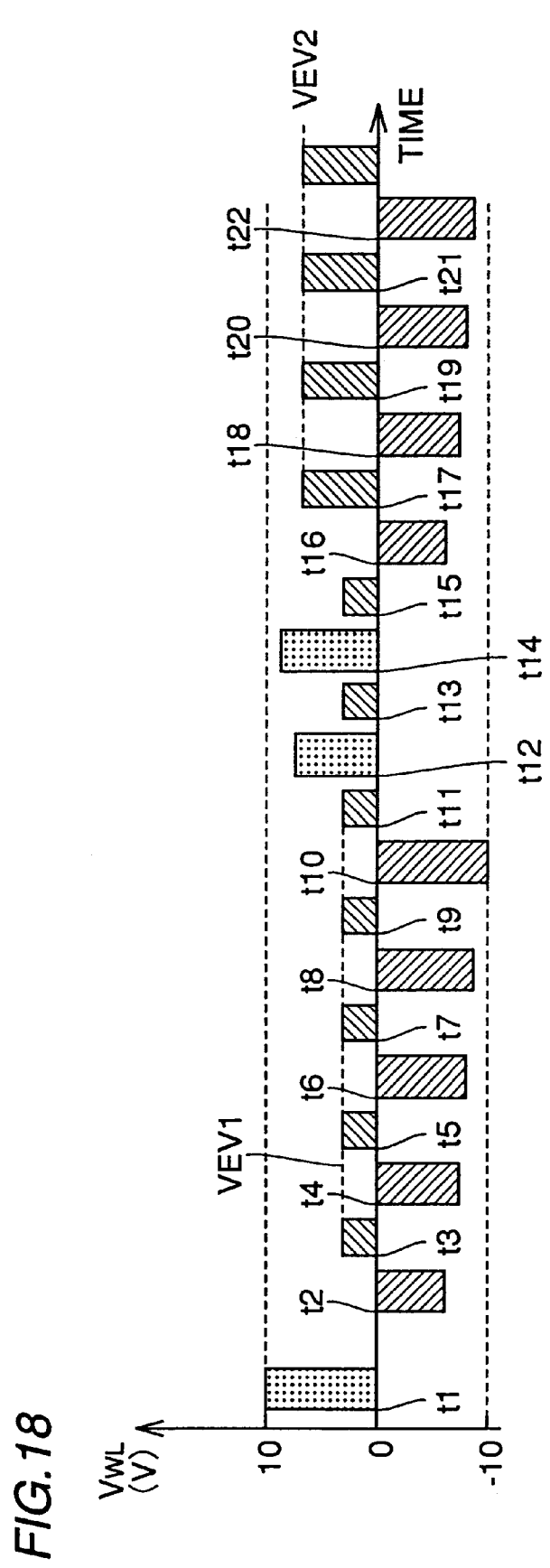
FIG. 18 is a waveform diagram showing changes in word line potential for showing the operation in the flowchart shown in FIG. 15.

FIG. 18 is a waveform diagram showing changes in word line potential for showing the operation in the flowchart shown in FIG. 15.

Referring to FIG. 18, the erase pulse which is applied in step S57 between the times t2 and t11 is processed to increase stepwise its intensity every time it is determined in step S52 that the erase verify is incomplete. Thereby, the erase time can be reduced while suppressing the number of memory transistors in the over-erased state.

Likewise, the block program pulse which is applied in step S53 between times t12 and t15 is processed to increase stepwise its pulse intensity in step S58 every time it is determined by the recovery verify in step S54 that the recovery is incomplete. Therefore, the time required for completing the recovery in step S54 can be reduced while suppressing the number of excessively recovered memory transistors.

Further, the erase pulse which is applied between times t16 and t22 is processed to increase stepwise its pulse intensity in step S59 every time it is determined by the erase verify in step S56 that the erasure is incomplete. Therefore, the time required for completing the erasure in step S56 can be reduced while suppressing the number of excessively erased memory transistors.

In the erase flow of the modification of the second embodiment described above, since erase verify voltage VEV2 in step S56 is set larger than erase verify voltage VEV1 in step S52, the erase time can be reduced as compared with the case where these erase verify voltages are equal to each other.

Third Embodiment

Figure 19:
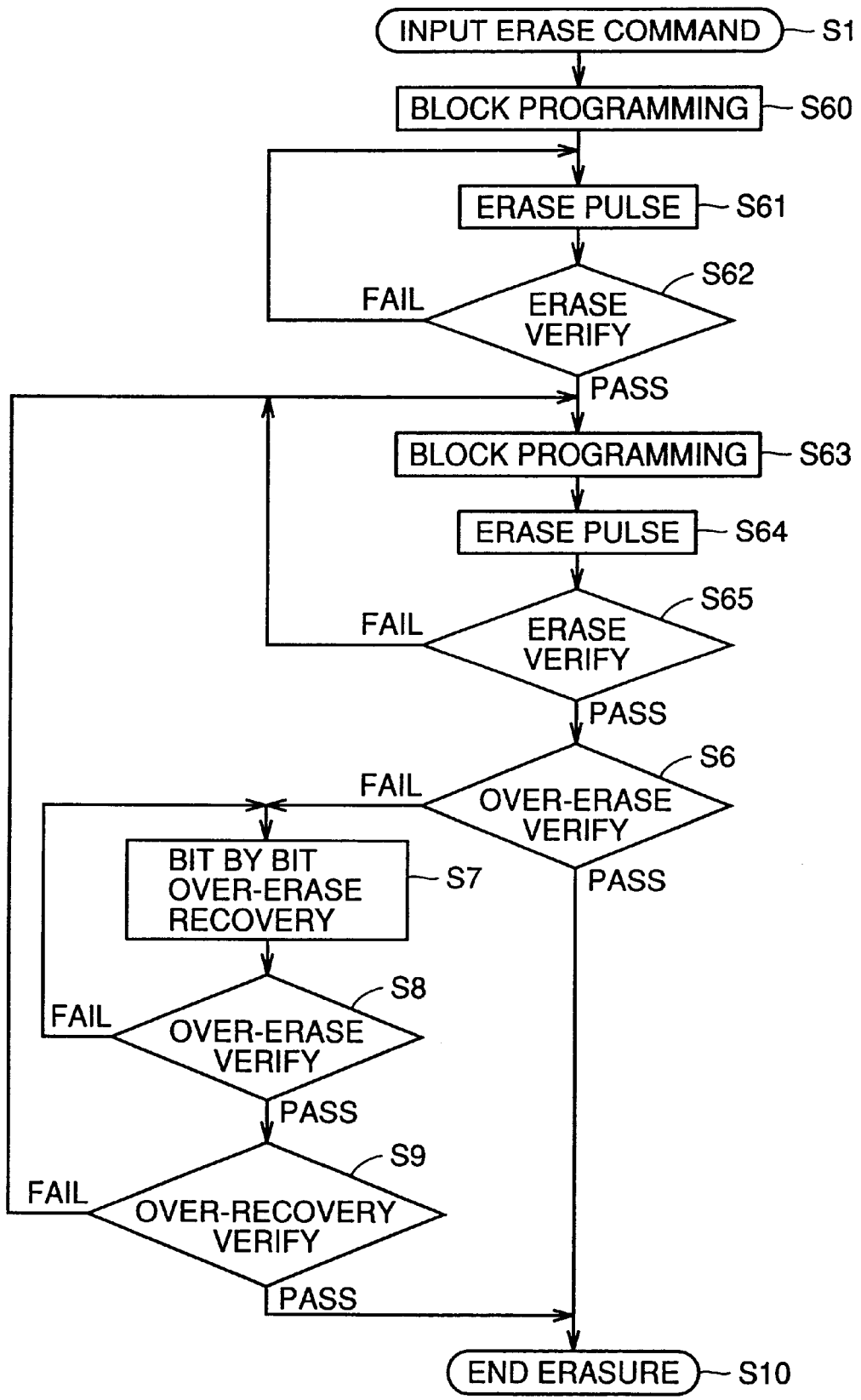
FIG. 19 is a flowchart of an erase sequence of a nonvolatile semiconductor memory device of a third embodiment.

FIG. 19 is a flowchart of the erase sequence of the nonvolatile semiconductor memory device of a third embodiment.

The flowchart shown in FIG. 19 differs from the manner of the flowchart shown in FIG. 2 in that steps S60–S66 are employed instead of steps S40–S46. Steps S6–S10 are similar to those in the flowchart shown in FIG. 2, and therefore description thereof is not repeated.

Figure 20:
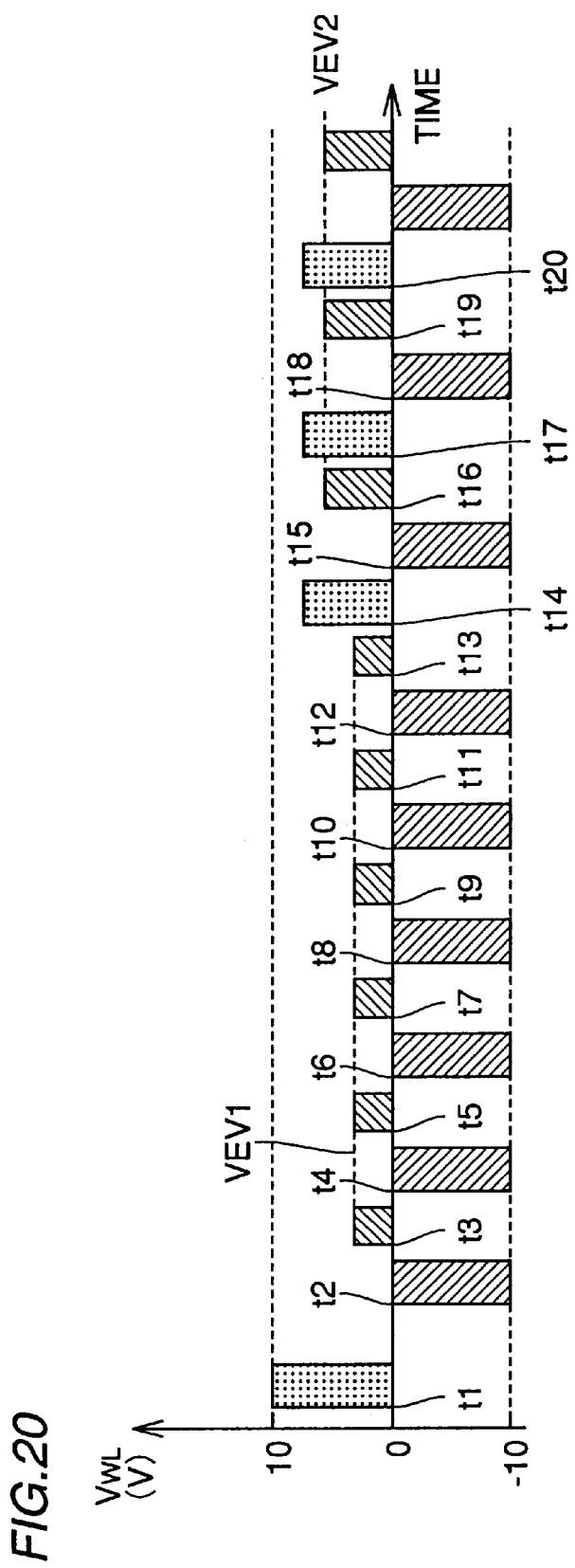
FIG. 20 is a waveform diagram showing changes in word line potential for showing the operation in the flowchart shown in FIG. 19.
Figure 21:
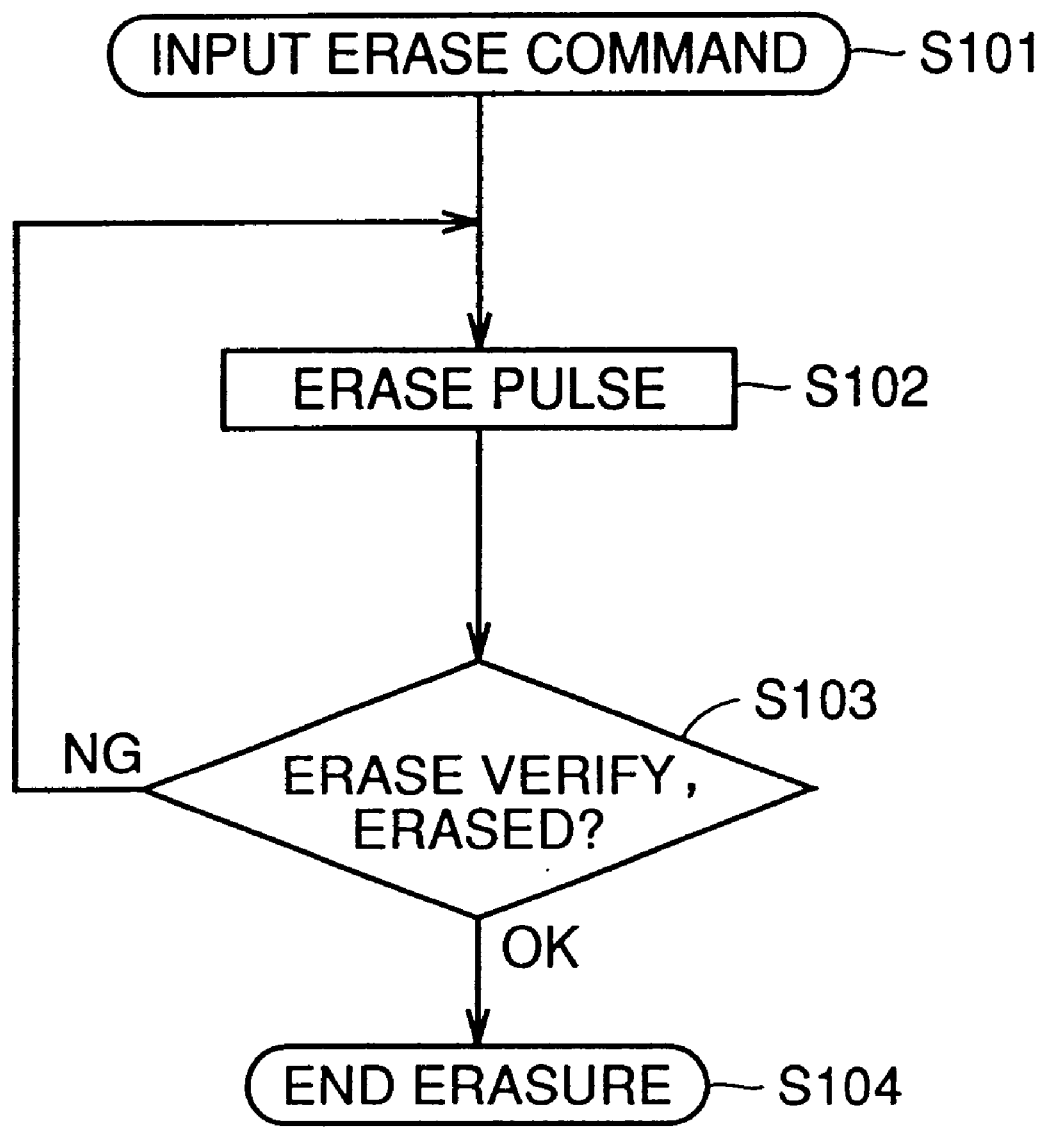
FIG. 21 is a flowchart showing an example of the most simple erase sequence of a conventional flash memory.

FIG. 20 is a waveform diagram showing changes in word line potential for showing the operation of the flowchart shown in FIG. 19.

Referring to FIGS. 19 and 20, the erase command is applied in S1, and the block program before erasure is performed at time t1 (step S60). At time t2, the erase pulse is applied (step S61).

Subsequently, a pulse for the erase verify in step S62 is applied at time t3. This pulse functions as a pulse for applying erase verify voltage VEV1 to the word line. Until this verify is completed, application of the erase pulse in step S61 is repeated between times t4 and t12.

When it is verified at time t12 by the erase verify in step S62 that the erasure is completed, the block program pulse in step S63 is applied at time t14. The erase pulse in step S64 is applied at time t15, and the erase verify in step S65 is performed at time t16. For the erase verify in step S65, the potential on word line is set to erase verify voltage VEV2, and it is determined whether the erasure is fully completed or not. Erase verify voltage VEV2 is larger than erase verify voltage VEV1.

Between times t17 and t20, application of the block program pulse and the erase pulse in steps S63 and S64 is repeated until the erase verify in step S65 is completed.

According to the above manner, erasure by the first erase pulse is executed in steps S61 and S62, and thereafter the erasing operation, which precisely reduces the threshold voltage, is performed in steps S63–S65. Even in the erase sequence of the third embodiment, the erase time can be reduced while narrowing the distribution width of the threshold voltage similarly to the first and second embodiments, compared with the prior art.

By setting erase verify voltage VEV2 in step S65 to be larger than erase verify voltage VEV1 in step S62, the erase time can be reduced, compared with the case of employing these erase verify voltages equal to each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a memory block including a plurality of memory transistors arranged in rows and columns;
    a plurality of word lines selecting the rows of said plurality of memory transistors, respectively;
    a plurality of bit lines provided corresponding to the columns of said plurality of memory transistors;
    a potential generating portion generating potentials to be applied to said plurality of word lines, said plurality of bit lines, and substrates and sources of said plurality of memory transistors; and
    a program/erase control portion controlling said potential generating portion to erase data in said memory block, said program/erase control portion including
        a first setting portion collectively and repetitively applying a first erase pulse to said plurality of memory transistors to set said plurality of memory transistors to a first erased state,
        a second setting portion setting said plurality of memory transistors to a second erased state providing over-erased memory transistors smaller in number than over-erased memory transistors in said first erased state, and
        a recovery control portion selectively performing recovery on any over-erased memory transistor among said plurality of memory transistors when said second erased state is verified;
        each of said memory transistors is an MOS transistor having a floating gate;
        said first erased state is achieved when said plurality of memory transistors have threshold voltages equal to or smaller than a first value; and
        said second erased state is achieved when said plurality of memory transistors have threshold voltages equal to or smaller than a second value.

2. The nonvolatile semiconductor memory device according to claim 1, wherein
    said second setting portion includes
    a first pulse control portion collectively applying a first program pulse to said plurality of memory transistors in said first erased state, and
    a second pulse control portion repeating an operation of collectively applying a second erase pulse to said plurality of memory transistors already supplied with said first program pulse until said plurality of memory transistors attain said second erased state.

3. The nonvolatile semiconductor memory device according to claim 1, wherein
    said second setting portion includes
    a first pulse control portion collectively applying a first program pulse to said plurality of memory transistors in said first erased state until said plurality of memory transistors attain a predetermined recovered state, and
    a second pulse control portion repeating an operation of collectively applying a second erase pulse to said plurality of memory transistors in said predetermined recovered state until said plurality of memory transistors attain said second erased state.

4. The nonvolatile semiconductor memory device according to claim 3, wherein
    said predetermined recovered state refers to a state in which the number of said memory transistors in said memory block having the threshold voltages smaller than said first value is smaller than a predetermined number.

5. The nonvolatile semiconductor memory device according to claim 1, wherein
    said second setting portion includes
    a first pulse applying portion for collectively applying a first program pulse to said plurality of memory transistors in said first erased state, and thereafter repeating an operation of collectively applying a second erase pulse to said plurality of memory transistors until said plurality of memory transistors attain said second erased state.

6. The nonvolatile semiconductor memory device according to claim 1, further comprising
    a pretreatment portion collectively applying a preliminary program pulse for performing preliminary programming before erasure to said plurality of memory transistors prior to setting said plurality of memory transistors to said first erased state.

7. The nonvolatile semiconductor memory device according to claim 6, wherein
    an amount of shift of the threshold voltage of said memory transistor caused by application of said program pulse is smaller than an amount of shift of the threshold voltage of said memory transistor caused by application of said preliminary program pulse.

8. A method of erasing data of a nonvolatile semiconductor memory device provided with a memory block including a plurality of memory transistors arranged in rows and columns, a plurality of word lines for selecting the rows of said plurality of memory transistors, respectively, a plurality of bit lines provided corresponding to the columns of said plurality of memory transistors, a potential generating portion for generating potentials to be applied to said plurality of word lines, said plurality of bit lines, and substrates and sources of said plurality of memory transistors, and a program/erase control portion for controlling said potential generating portion to erase data in said memory block, comprising the steps of:
    collectively and repetitively applying a first erase pulse to said plurality of memory transistors to set said plurality of memory transistors to a first erased state; and setting said plurality of memory transistors to a second erased state providing over-erased memory transistors smaller in number than over-erased memory transistors in said first erased state; and performing selectively recovery on any over-erased memory transistor among said plurality of memory transistors when said second erased state is verified, wherein each of said memory transistors is an MOS transistor having a floating gate, said first erased state is achieved when said plurality of memory transistors have threshold voltages equal to or smaller than a first value, and said second erased state is achieved when said plurality of memory transistors have threshold voltages equal to or smaller than a second value.

9. The method of erasing data of the nonvolatile semiconductor memory device according to claim 8, wherein said step of setting said plurality of memory transistors to said second erased state includes the steps of collectively applying a first program pulse to said plurality of memory transistors in said first erased state, and repeating an operation of collectively applying a second erase pulse to said plurality of memory transistors already supplied with said first program pulse until said plurality of memory transistors attain said second erased state.

10. The method of erasing data of the nonvolatile semiconductor memory device according to claim 8, wherein said step of setting said plurality of memory transistors to said second erased state includes the steps of collectively applying a first program pulse to said plurality of memory transistors in said first erased state until said plurality of memory transistors attain a predetermined recovered state, and repeating an operation of collectively applying a second erase pulse to said plurality of memory transistors in said predetermined recovered state until said plurality of memory transistors attain said second erased state.

11. The method of erasing data of the nonvolatile semiconductor memory device according to claim 10, wherein said predetermined recovered state refers to a state in which the number of said memory transistors in said memory block having the threshold voltages smaller than said first value is smaller than a predetermined number.

12. The method of erasing data of the nonvolatile semiconductor memory device according to claim 8, wherein said step of setting said plurality of memory transistors to said second erased state includes the step of collectively applying a first program pulse to said plurality of memory transistors in said first erased state, and thereafter repeating an operation of collectively applying a second erase pulse to said plurality of memory transistors until said plurality of memory transistors attain said second erased state.

13. The method of erasing data of the nonvolatile semiconductor memory device according to claim 8, further comprising the step of collectively applying a preliminary program pulse for performing preliminary programming before erasure to said plurality of memory transistors prior to said step of setting to said first erased state.

14. The method of erasing data of the nonvolatile semiconductor memory device according to claim 13, wherein an amount of shift of the threshold voltage of said memory transistor caused by application of said program pulse is smaller than an amount of shift of the threshold voltage of said memory transistor caused by application of said preliminary program pulse.

15. A nonvolatile semiconductor memory device comprising:

a memory block including a plurality of memory transistors arranged in rows and columns;

a plurality of word lines selecting the rows of said plurality of memory transistors, respectively;

a plurality of bit lines provided corresponding to the columns of said plurality of memory transistors;

a potential generating portion generating potentials to be applied to said plurality of word lines, said plurality of bit lines; and substrates and sources of said plurality of memory transistors; and a program/erase control portion controlling said potential generating portion to erase data in said memory block, said program/erase control portion including a first setting portion collectively and repetitively applying a first erase pulse to said plurality of memory transistors to set said plurality of memory transistors to a first erased state, a second setting portion setting said plurality of memory transistors to a second erased state, and a recovery control portion selectively performing recovery on any over-erased memory transistor among said plurality of memory transistors when said second erased state is verified;

each of said memory transistors in a MOS transistor having a floating gate;

said first erased state is achieved when said plurality of memory transistors have threshold voltages equal to or smaller than a first erase-verify voltage; and said second erased state is achieved when said plurality of memory transistors have threshold voltages equal to or smaller than a second erase-verify voltage which is higher than said first erase-verify voltage.

16. The nonvolatile semiconductor memory device according to claim 15, wherein said second setting portion includes a first pulse control portion collectively applying a first program pulse to said plurality of memory transistors in said first erased state, and a second pulse control portion repeating an operation of collectively applying a second erase pulse to said plurality of memory transistors already supplied with said first program pulse until said plurality of memory transistors attain said second erased state.

17. The nonvolatile semiconductor memory device according to claim 15, wherein said second setting portion includes a first pulse control portion collectively applying a first program pulse to said plurality of memory transistors in said first erased state until said plurality of memory transistors attain a predetermined recovered state, and a second pulse control portion repeating an operation of collectively applying a second erase pulse to said plurality of memory transistors in said predetermined recovered state until said plurality of memory transistors attain said second erased state.

* * * * *